United States Patent
Su et al.

(10) Patent No.: US 9,985,042 B2
(45) Date of Patent: May 29, 2018

(54) METHOD OF INTEGRATING FINFET CMOS DEVICES WITH EMBEDDED NONVOLATILE MEMORY CELLS

(71) Applicant: Silicon Storage Technology, Inc., San Jose, CA (US)

(72) Inventors: Chien-Sheng Su, Saratoga, CA (US); Jeng-Wei Yang, Zhubei (TW); Man-Tang Wu, Xinpu Township (TW); Chun-Ming Chen, New Taipei (TW); Hieu Van Tran, San Jose, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 30 days.

(21) Appl. No.: 15/489,548

(22) Filed: Apr. 17, 2017

(65) Prior Publication Data

US 2017/0345840 A1    Nov. 30, 2017

Related U.S. Application Data

(60) Provisional application No. 62/341,005, filed on May 24, 2016.

(51) Int. Cl.
| | |
|---|---|
| *H01L 21/306* | (2006.01) |
| *H01L 21/8238* | (2006.01) |
| *H01L 27/11568* | (2017.01) |
| *H01L 21/3065* | (2006.01) |

(52) U.S. Cl.
CPC .... *H01L 27/11568* (2013.01); *H01L 21/3065* (2013.01); *H01L 21/30604* (2013.01); *H01L 21/30625* (2013.01); *H01L 21/823821* (2013.01)

(58) Field of Classification Search
CPC ................. H01L 21/30604; H01L 21/30625
See application file for complete search history.

(56) References Cited

U.S. PATENT DOCUMENTS

| | | | |
|---|---|---|---|
| 7,315,056 B2 | 1/2008 | Klinger et al. | |
| 8,461,640 B2 | 6/2013 | Hu et al. | |
| 9,276,005 B1 | 3/2016 | Zhou et al. | |
| 2006/0154421 A1* | 7/2006 | Choi | ................. H01L 21/26586 438/265 |
| 2007/0080387 A1 | 4/2007 | Liu | |
| 2007/0138514 A1 | 6/2007 | Chang | |
| 2010/0230762 A1 | 9/2010 | Burnett | |
| 2013/0032872 A1* | 2/2013 | Kotov | ............... H01L 21/28273 257/319 |
| 2014/0179076 A1* | 6/2014 | Shinohara | ......... H01L 21/28273 438/275 |
| 2015/0008451 A1 | 1/2015 | Su | |

(Continued)

Primary Examiner — Mounir Amer
(74) Attorney, Agent, or Firm — DLA Piper LLP (US)

(57) ABSTRACT

A method of forming a memory device with memory cells over a planar substrate surface and FinFET logic devices over fin shaped substrate surface portions, including forming a protective layer over previously formed floating gates, erase gates, word line poly and source regions in a memory cell portion of the substrate, then forming fins into the surface of the substrate and forming logic gates along the fins in a logic portion of the substrate, then removing the protective layer and completing formation of word line gates from the word line poly and drain regions in the memory cell portion of the substrate.

13 Claims, 46 Drawing Sheets

(56) References Cited

U.S. PATENT DOCUMENTS

2015/0171103 A1* 6/2015 Ishida ............... H01L 27/11573
                                                           438/424
2016/0307909 A1* 10/2016 Tseng ................. H01L 27/1157

* cited by examiner

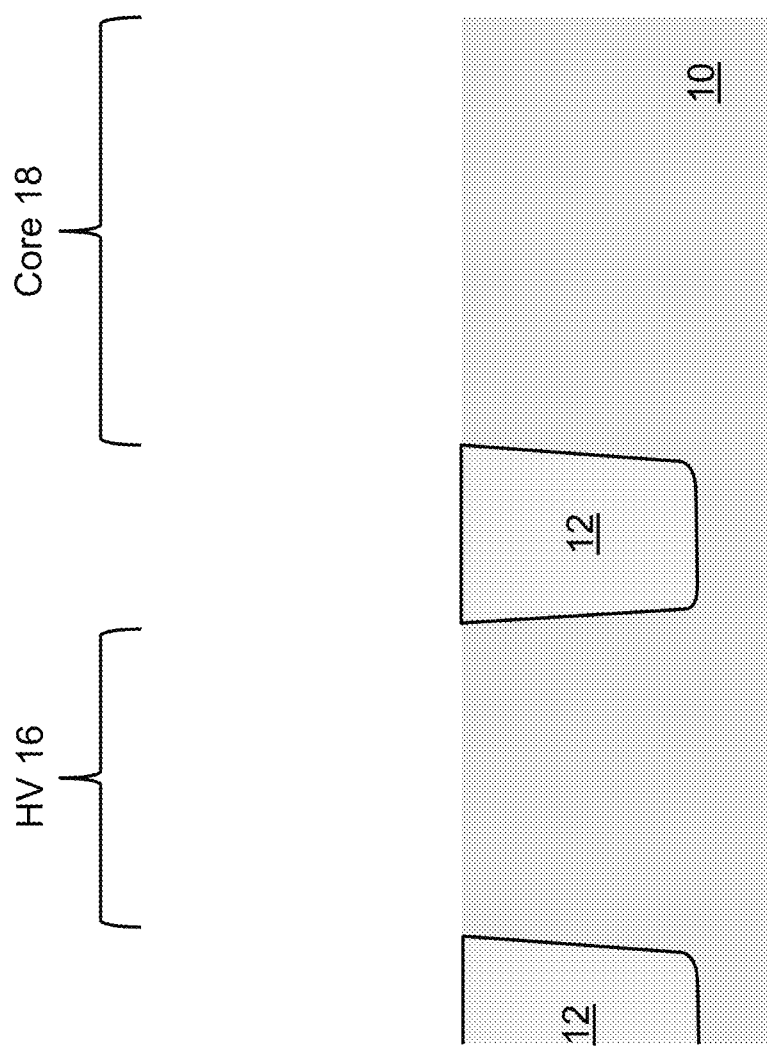

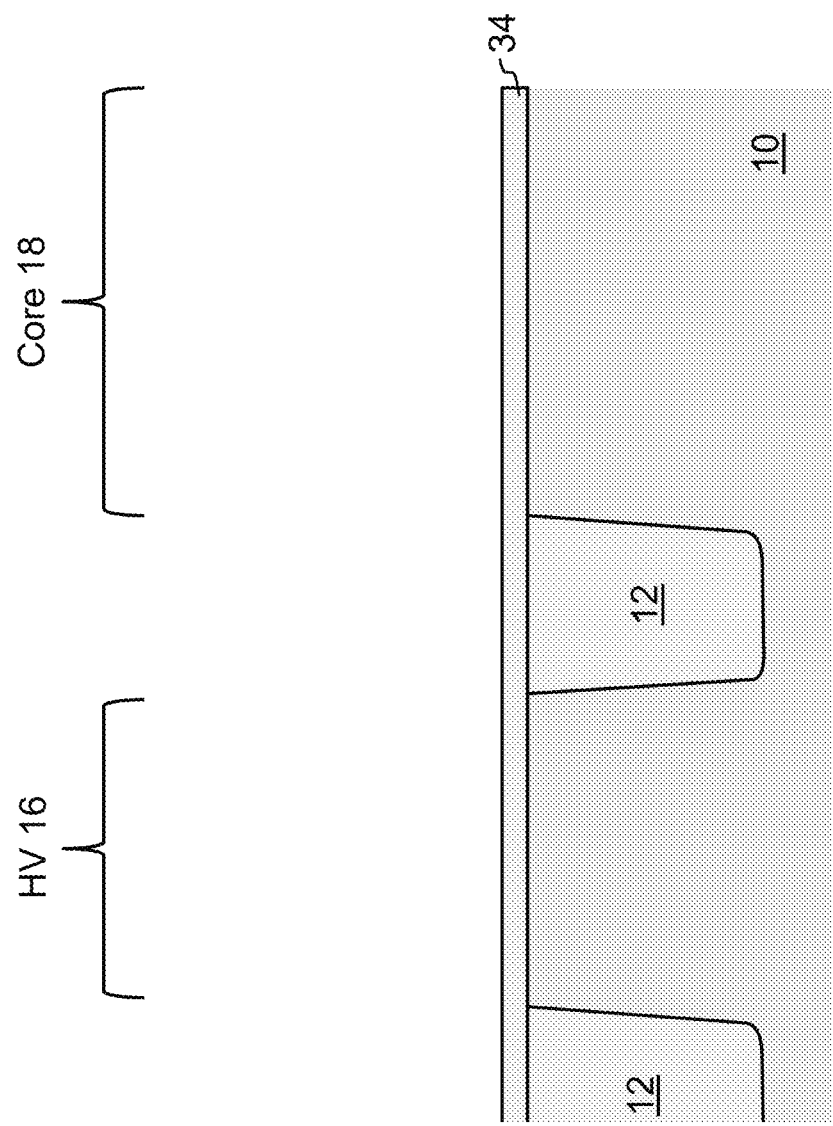

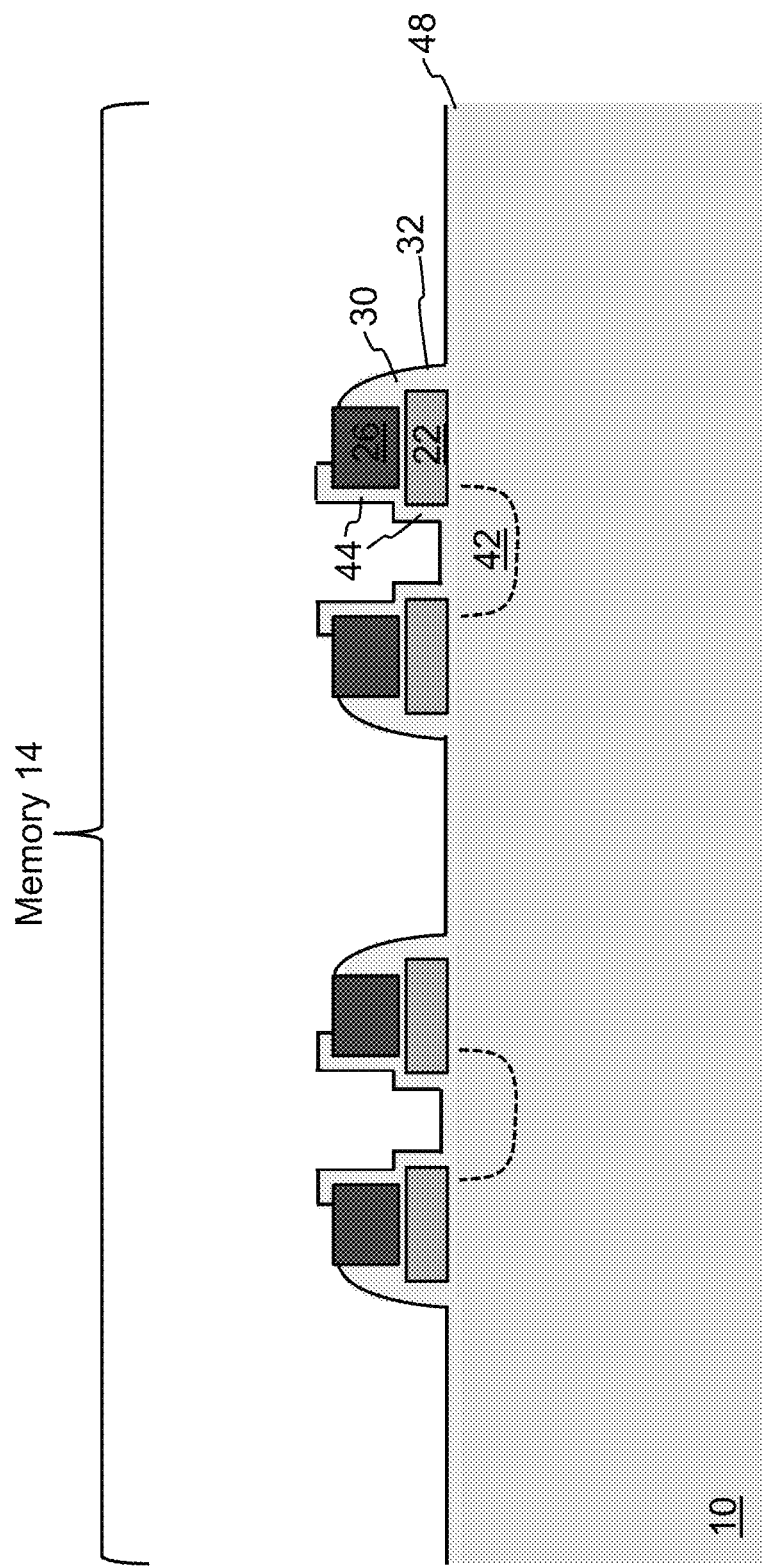

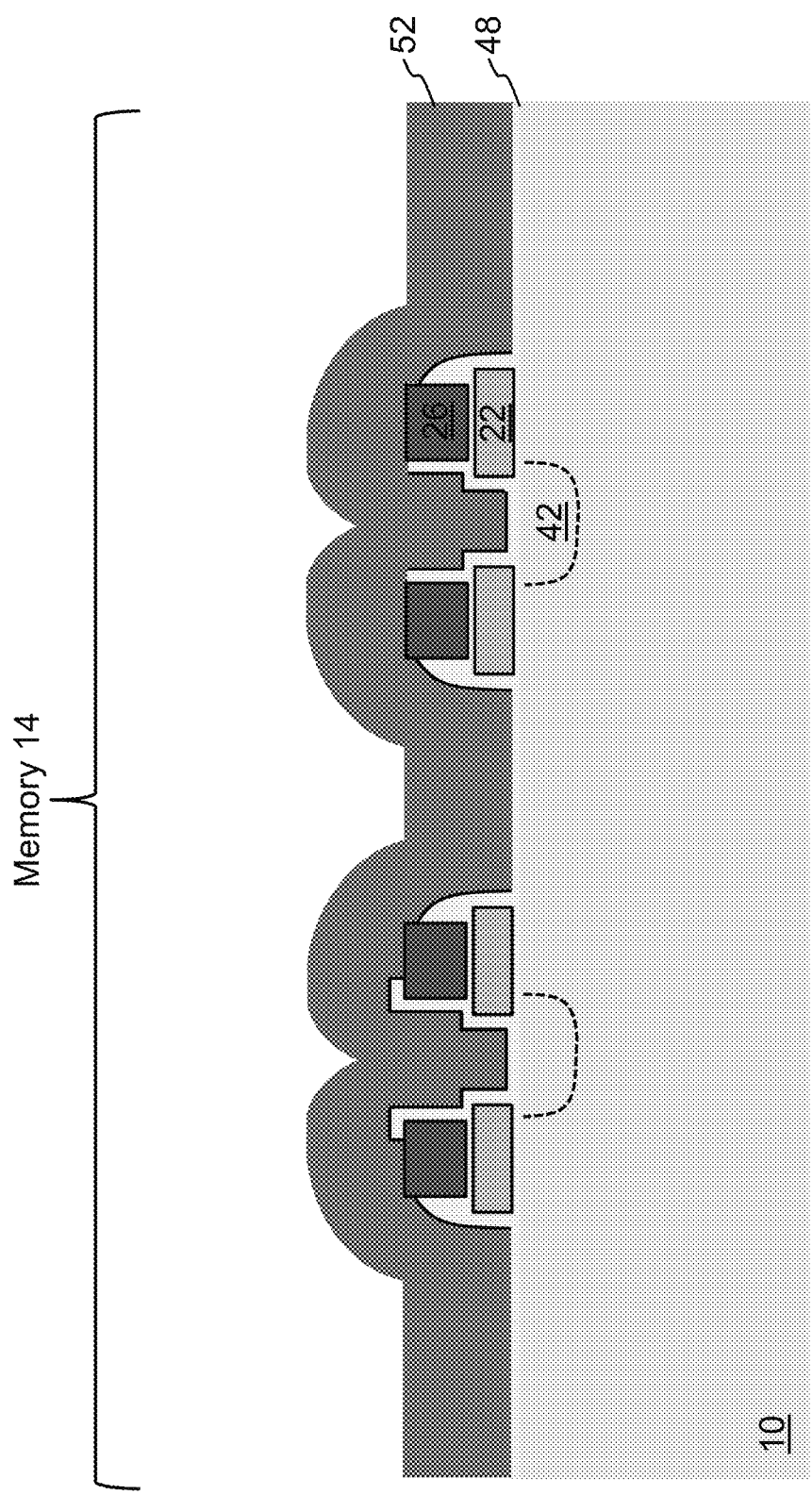

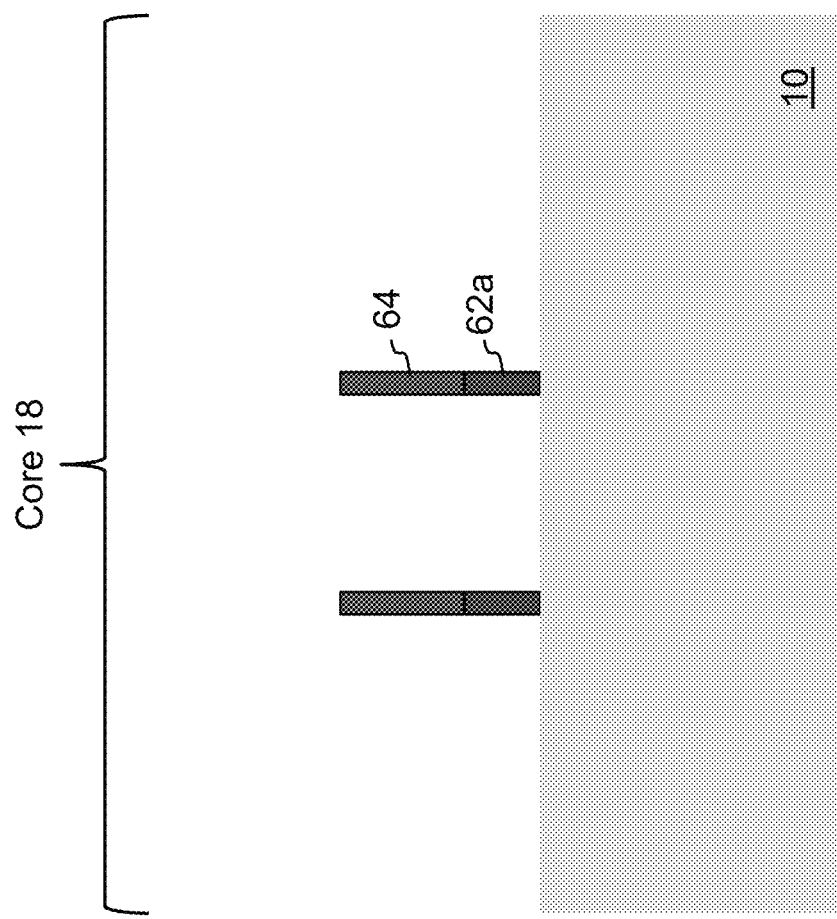

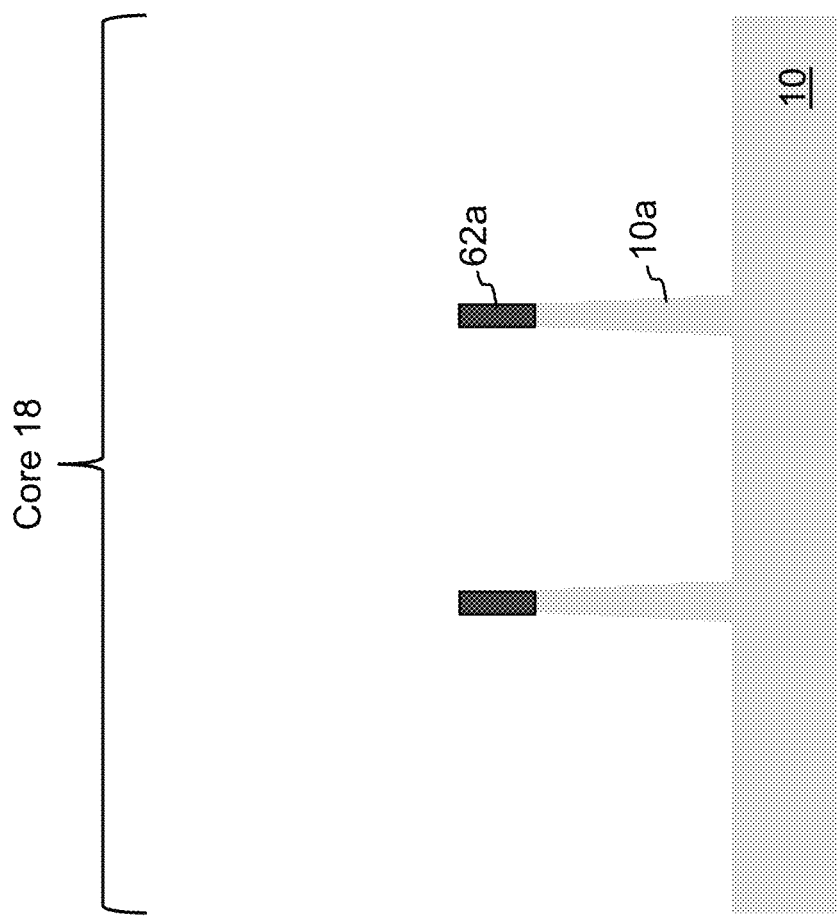

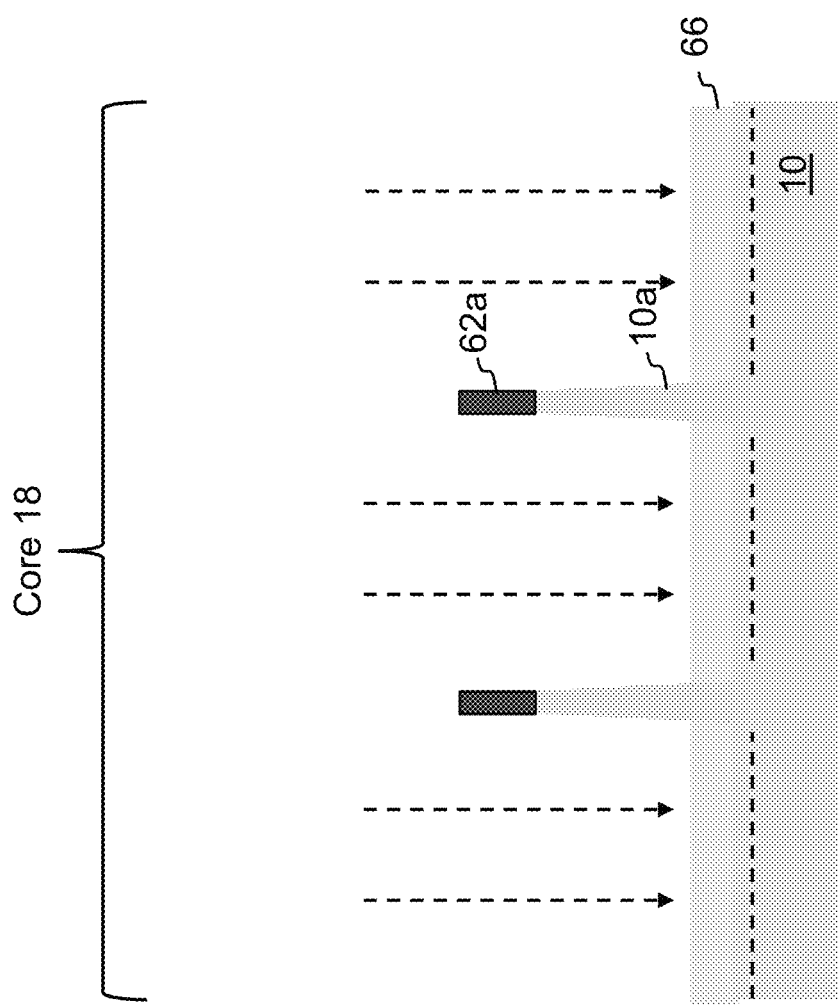

METHOD OF INTEGRATING FINFET CMOS DEVICES WITH EMBEDDED NONVOLATILE MEMORY CELLS

This application claims the benefit of U.S. Provisional Application No. 62/341,005, filed May 24, 2016, and which is incorporated herein by reference.

FIELD OF THE INVENTION

The present invention relates to nonvolatile memory devices.

BACKGROUND OF THE INVENTION

Split gate nonvolatile memory cell devices are known. For example, U.S. Pat. No. 7,315,056 discloses a split-gate nonvolatile memory cell device, which is incorporated herein by reference for all purposes. The channel region is defined between a source and a drain formed in a semiconductor substrate. A first part of the channel region is controlled by a floating gate, while a second part of the channel region is controlled by a select gate. An erase/program gate is disposed over the source region. The memory cells can be formed on the planar surface of the substrate, or around fin shaped portions of the substrate to increase current flow, such as U.S. Pat. No. 8,461,640 (a FinFET configuration), which is incorporated herein by reference for all purposes.

It is also known to form logic (CMOS) devices on the same wafer substrate as the non-volatile memory cells. See for example, U.S. Pat. No. 9,276,005. However, processing steps in forming the memory cells can adversely affect the previously fabricated logic devices, and vice versa. Moreover, as device geometries continue to shrink, it is difficult to form logic and memory devices on the same substrate with each providing the desired performance.

BRIEF SUMMARY OF THE INVENTION

The aforementioned issues are addressed by a method of forming a memory device that includes forming pairs of spaced apart first conductive blocks over and insulated from a first surface area of the substrate, wherein for each pair of the spaced apart first conductive blocks, an area between the first conductive blocks defines an inner region, and areas outside of the first conductive blocks define outer regions. The method further includes forming a plurality of source regions each disposed in the substrate and in one of the inner regions, forming second conductive blocks each disposed over and insulated from one of the source regions, forming third conductive blocks each disposed in one of the outer regions and disposed over and insulated from the substrate, and forming a protective layer over the first, second and third conductive blocks. After the forming of the protective layer, the method includes performing a silicon etch in a second surface area of the substrate to form fins of the substrate, and forming fourth conductive blocks each extending along and insulated from top and side surfaces of one of the fins of the substrate. After the performing of the silicon etch and the forming of the fourth conductive blocks, the method includes removing the protective layer, performing an etch to selectively remove a middle portion of each of the third conductive blocks, forming a plurality of drain regions each disposed in the substrate and adjacent to one of the third conductive blocks, and forming a second source region and a second drain region in each of the fins of the substrate.

A method of forming a memory device can includes forming pairs of spaced apart first conductive blocks over and insulated from a first surface area of the substrate, wherein for each pair of the spaced apart first conductive blocks, an area between the first conductive blocks defines an inner region, and areas outside of the first conductive blocks define outer regions. The method includes forming a plurality of source regions each disposed in the substrate and in one of the inner regions, forming a first oxide layer on the first surface area of the substrate, and on second and third surface areas of the substrate, removing the first oxide layer from the first surface area of the substrate, forming a second oxide layer on the first surface area of the substrate, forming a polysilicon layer over the first, second and third surface areas of the substrate, planarizing a top surface of the polysilicon layer over the first surface area of the substrate (leaving first blocks of the polysilicon layer each disposed over and insulated from one of the source regions and second blocks of the polysilicon layer each disposed in one of the outer regions and on the second oxide layer), and forming a protective layer over the first conductive blocks and over the first and second blocks of the poly silicon layer. After the forming of the protective layer, the method includes removing the polysilicon layer and the first oxide layer from the second surface area of the substrate, performing a silicon etch in a second surface area of the substrate to form fins of the substrate, and forming second conductive blocks each extending along and insulated from top and side surfaces of one of the fins of the substrate. After the performing of the silicon etch and the forming of the second conductive blocks, the method includes removing the protective layer, performing an etch to selectively remove a middle portion of each of the second blocks of the polysilicon, and selected portions of the polysilicon layer over the third surface area of the substrate leaving third blocks of the polysilicon, forming a plurality of drain regions each disposed in the substrate and adjacent to one of the second blocks of polysilicon, forming a second source region and a second drain region in each of the fins of the substrate, and forming third source regions and third drain regions in the third surface area of the substrate adjacent to the third blocks of the polysilicon.

Other objects and features of the present invention will become apparent by a review of the specification, claims and appended figures.

BRIEF DESCRIPTION OF THE DRAWINGS

FIGS. 3A-14A are side cross sectional views of the memory area of the substrate, illustrating further steps in the formation of memory cells therein.

FIGS. 3B-14B are side cross sectional views of the HV and core areas of the substrate, illustrating further steps in the formation of logic devices therein.

FIGS. 15-18 are side cross sectional views of the core area of the substrate, illustrating further steps in the formation of logic devices therein.

DETAILED DESCRIPTION OF THE INVENTION

The present invention is the integration of non-volatile memory cells over a planar substrate surface with FinFET CMOS devices all on the same silicon substrate. In this process, embedded memory cells are fabricated up to word line poly planarization and then protected with nitride or nitride/oxide composite films while FinFET devices in the core area of the substrate are formed. After the formation of the FinFET logic devices, the embedded memory cells are exposed for word line formation and cell fabrication completion.

Figure 1:
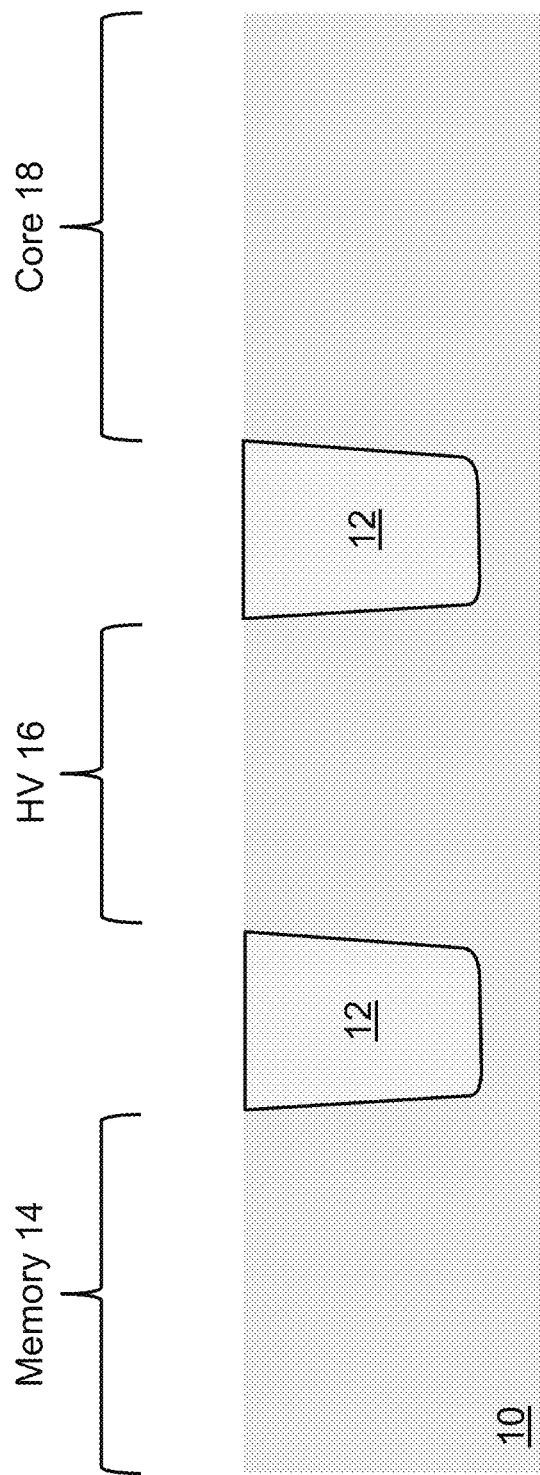
FIG. 1 is a side cross sectional view of memory, HV and core areas of the substrate, illustrating the beginning steps in the formation of memory cells and logic devices therein.

The process begins by forming isolation regions 12 of oxide in the semiconductor substrate 10, as shown in FIG. 1. This process (STI trench etch, and oxide fill) is well known in the art. The STI insulation isolates adjacent memory cells from each other in the memory cell area 14 (memory area) of the substrate 10, and insulates high voltage area(s) 16 (HV area) and core logic area(s) 18 (core area) of the substrate 10 from each other (in which high voltage devices and core logic devices, respectively, are formed).

Figure 2:
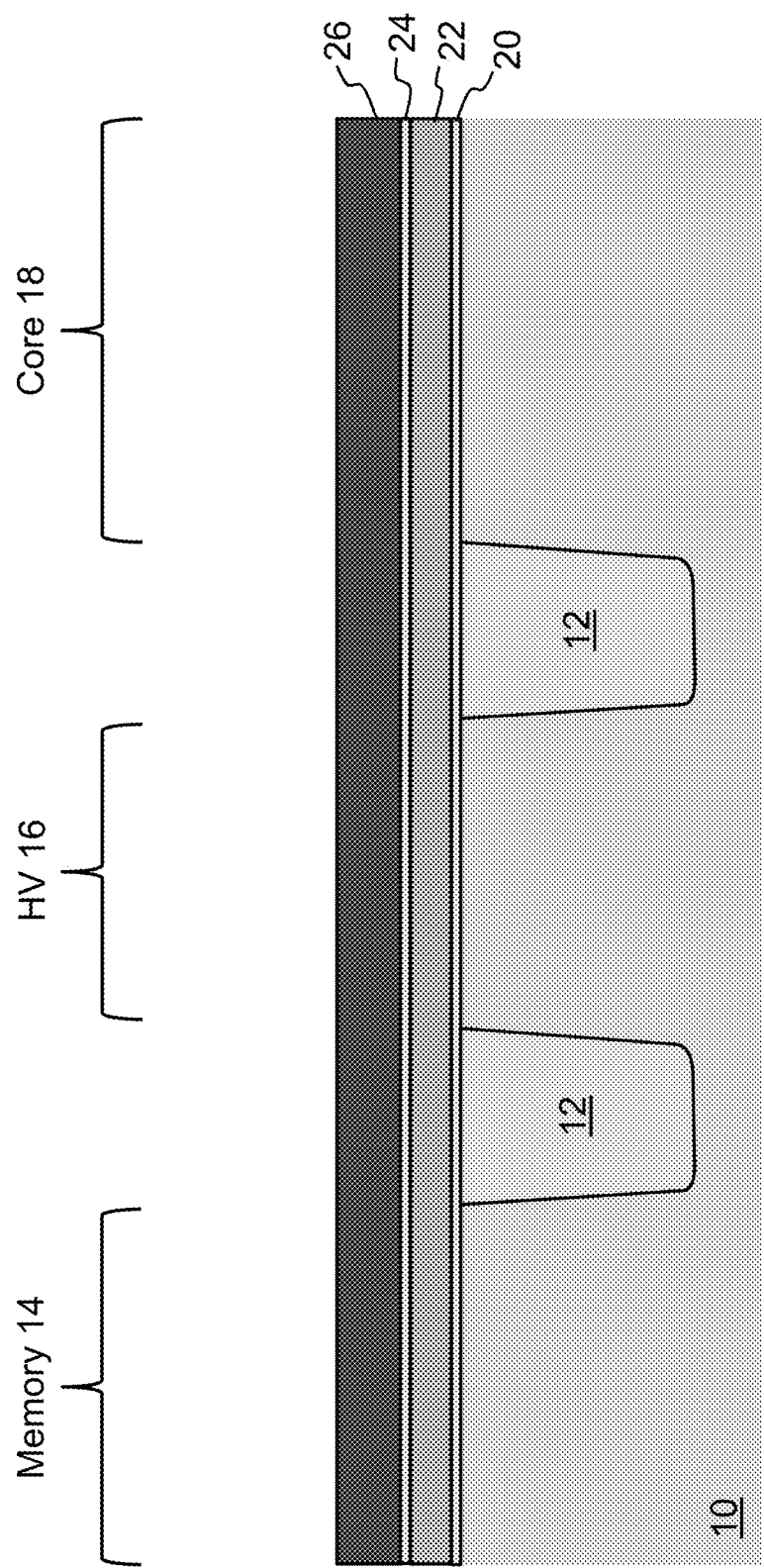
FIG. 2 is a side cross sectional view of the memory, HV and core areas of the substrate, illustrating further steps in the formation of memory cells and logic devices therein.
Figure 3A:
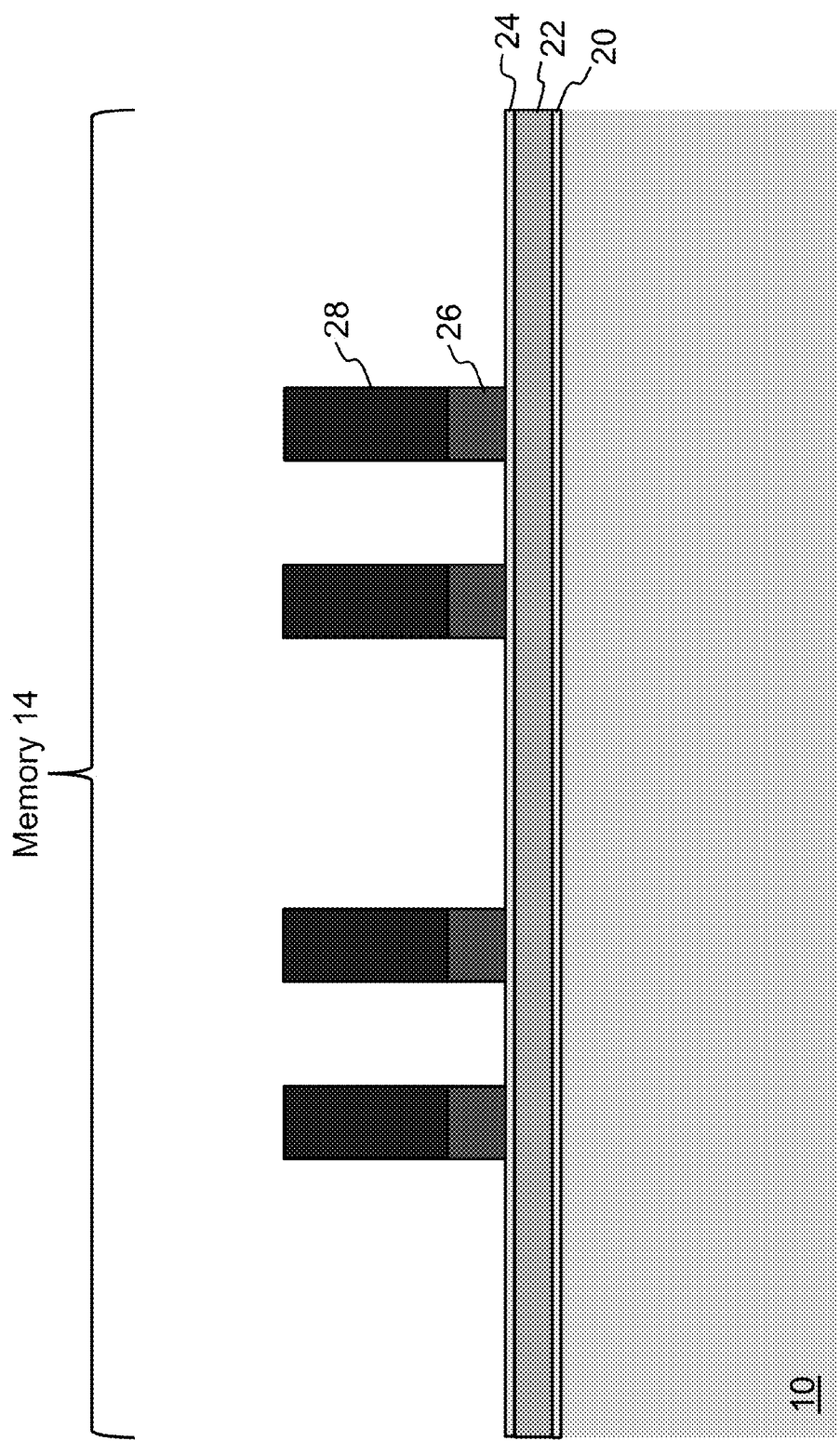
Figure 3B:
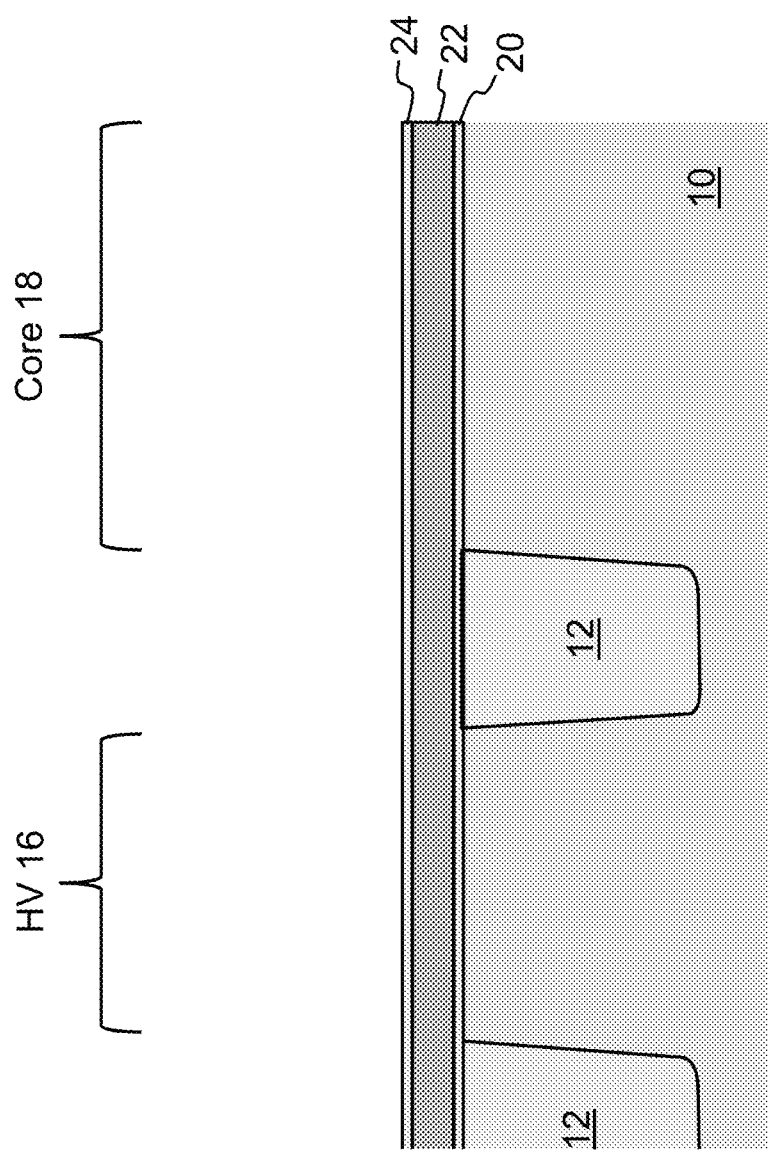

The process continues by forming a layer of silicon dioxide (oxide) 20 on substrate 10. A layer of polysilicon (poly) 22 is formed on oxide 20. A buffered oxide layer 24 is formed on poly 22. A silicon nitride (nitride) 26 is formed on the buffered oxide 24. The resulting structure is shown in FIG. 2. Patterned photo resist 28 is formed over the structure by a photolithographic masking process, in which a layer of photo resist is formed over the structure, followed by selective exposure of the photo resist using a mask to develop portions of the photo resist, followed by selective removal of portions of the photo resist. Blocks of photo resist 28 remain in the memory cell area only. A nitride etch is then used to remove exposed portions of the nitride layer 26, leaving blocks of nitride 26 under the blocks of photo resist 28 in the memory area 14, as shown in FIG. 3A. Nitride 26 is removed from the HV/core areas 16/18, as shown in FIG. 3B.

Figure 4A:
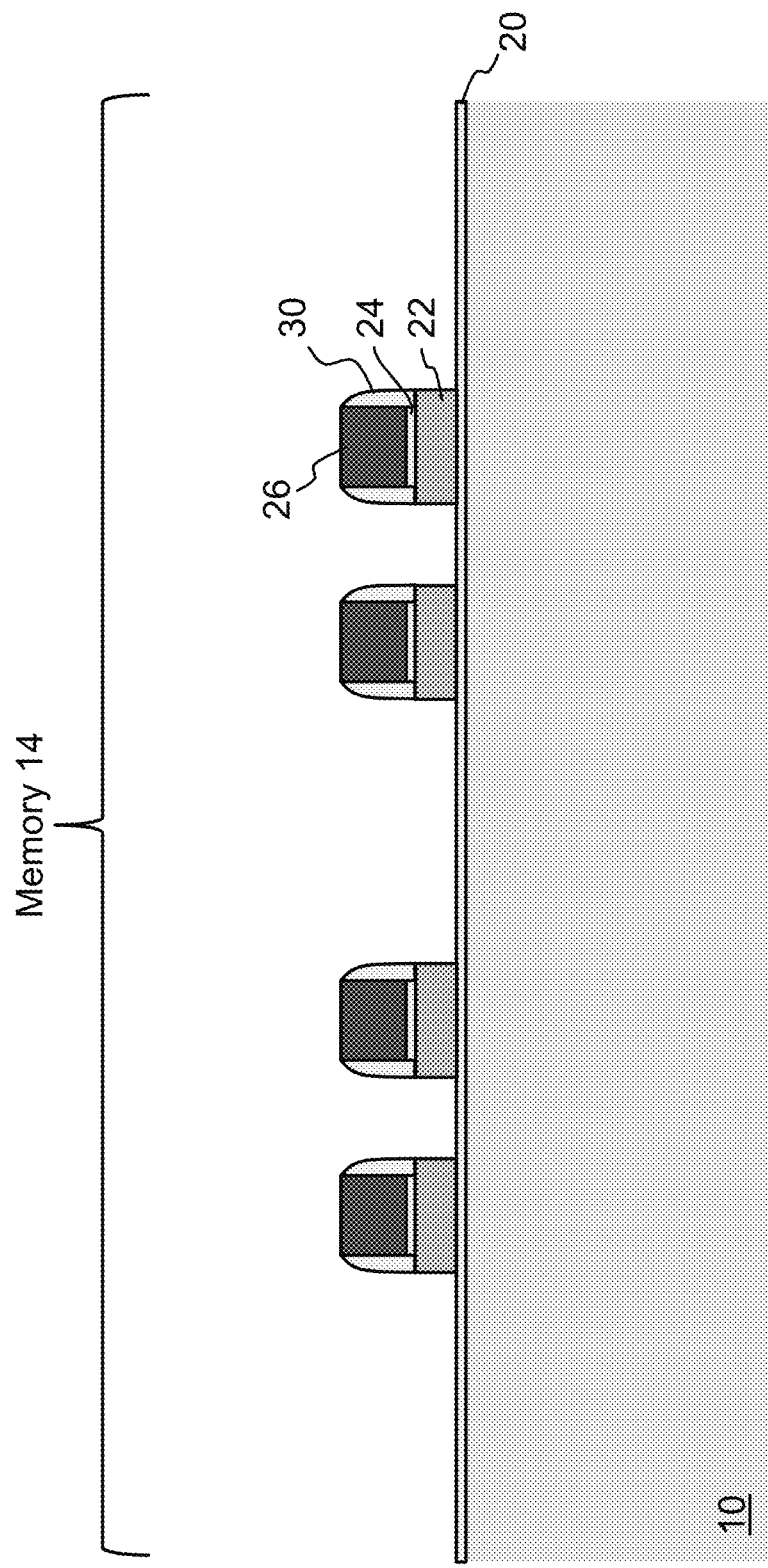
Figure 4B:
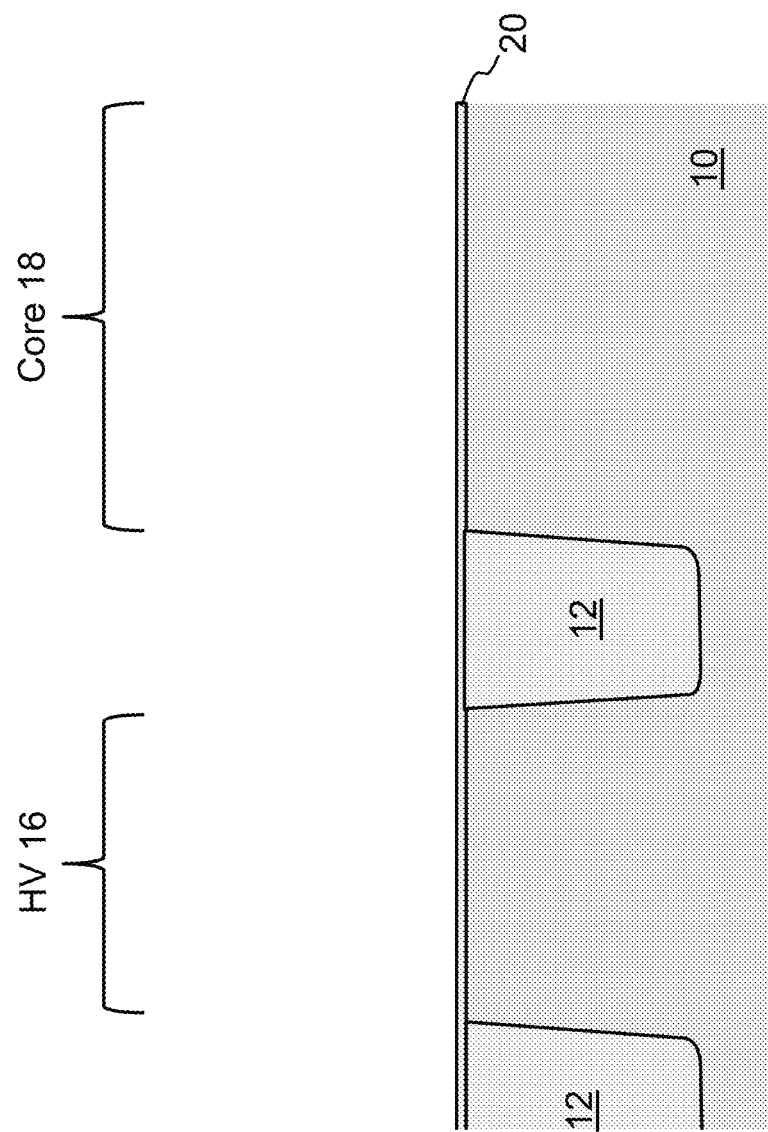

After photo resist 28 is removed, oxide spacers 30 are formed along the sides of the nitride blocks 26 in the memory cell area 14. Formation of spacers is well known, and involves forming a layer of material, followed by an anisotropic etch to remove the material on horizontal surfaces but leaving material along vertical surfaces (typically with a rounded upper surface). A poly etch is then used to remove exposed portions of the poly layer 22, leaving poly blocks 22 under the blocks of nitride 26 and spacers 30 in the memory cell area 14. The resulting structure in the memory cell area 14 is shown in 4A. In the HV/core areas 16/18, these processing steps end up removing buffered oxide 24 and poly layer 22, as shown in FIG. 4B.

Figure 5A:
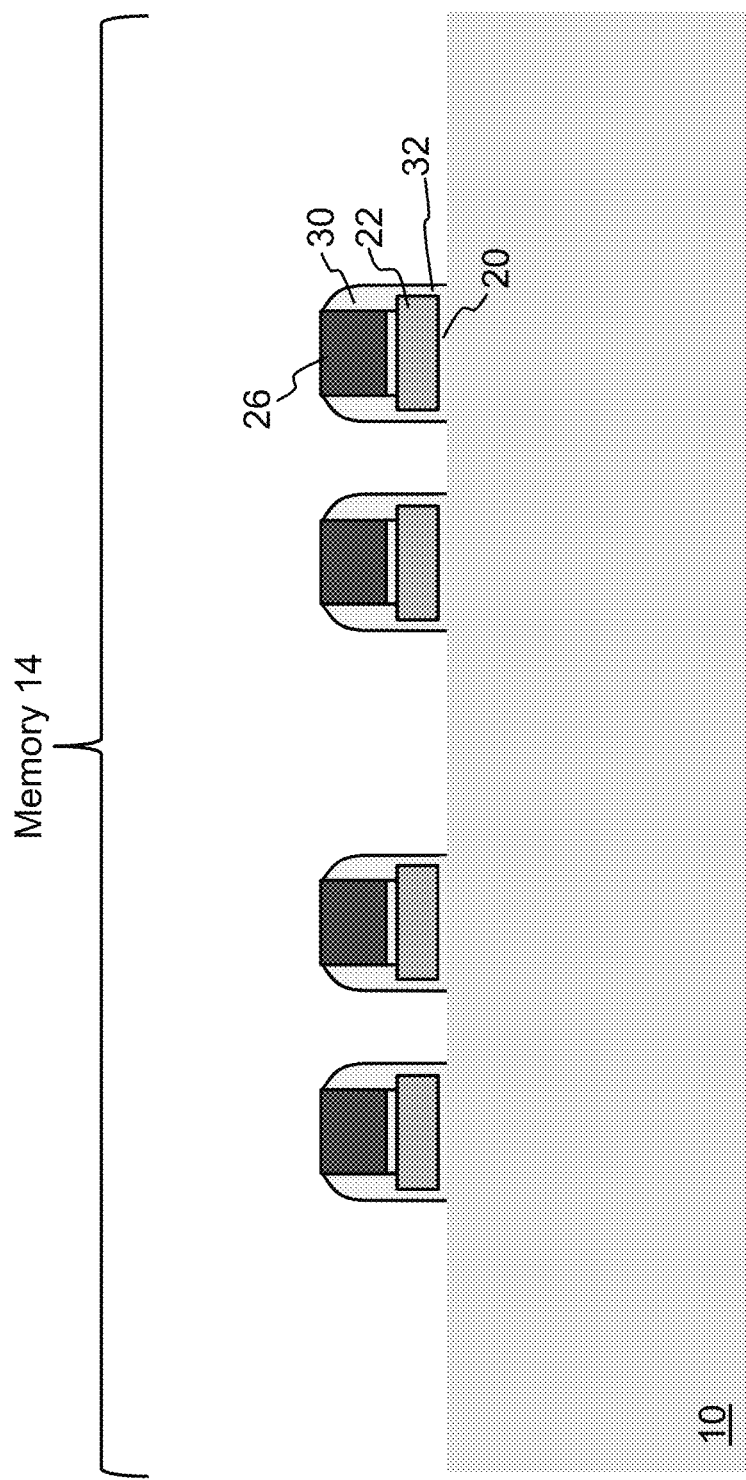
Figure 6A:
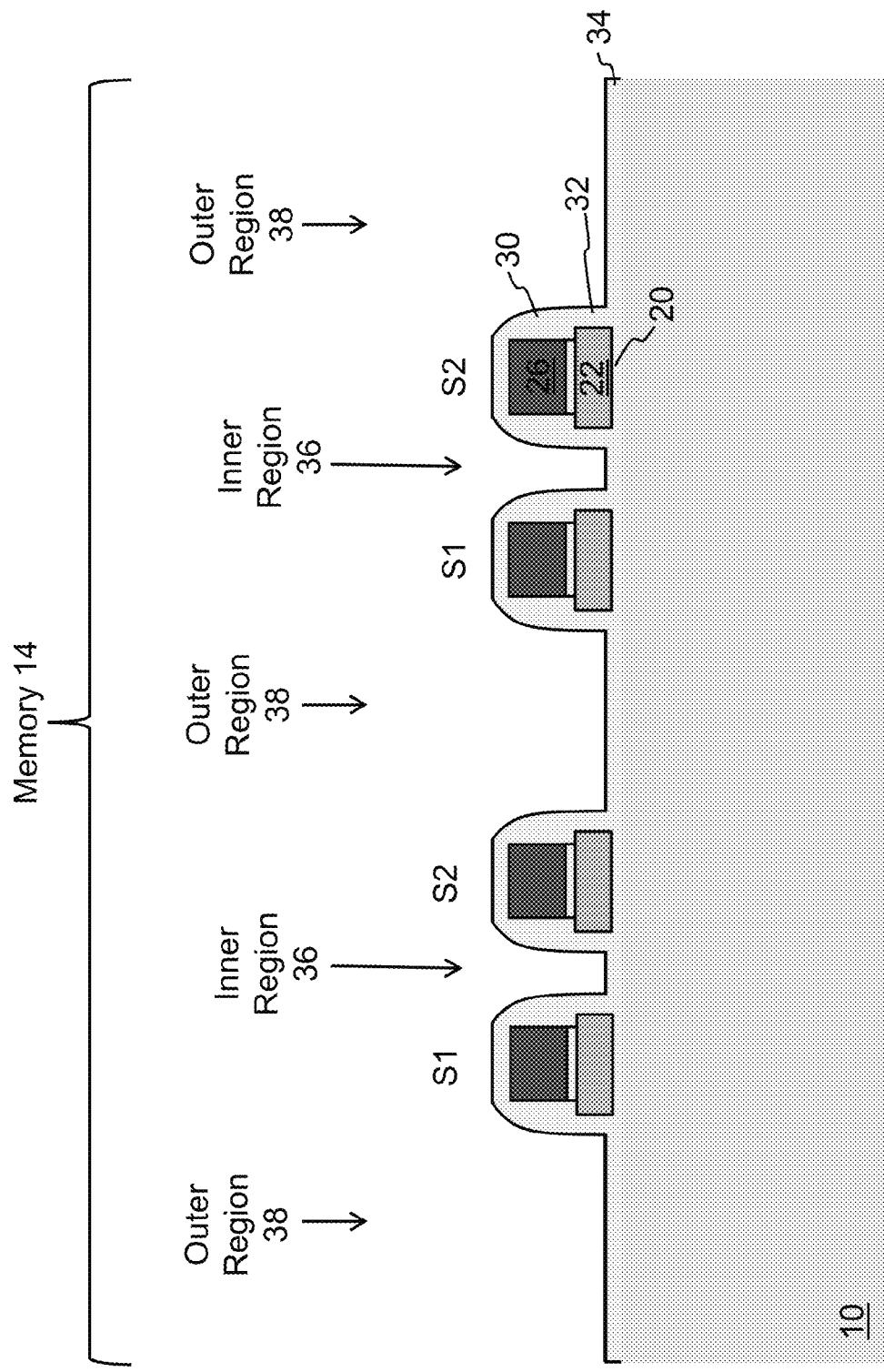
Figure 6B:
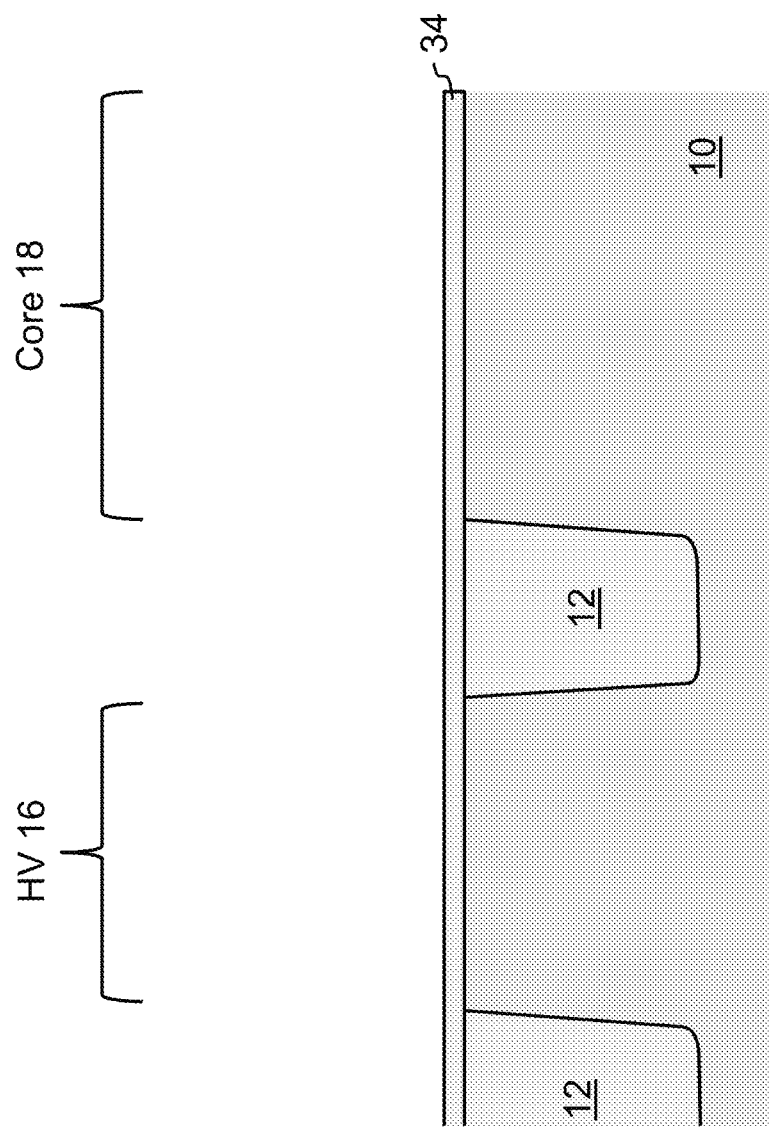

Spacers 32 are formed along the sides of the poly blocks 22 by oxide deposition and etch, preferably by a HTO oxide process. The oxide etch removes exposed portions of oxide layer 20 in all areas, as illustrated in FIGS. 5A and 5B. Oxide deposition is then used to form a layer of oxide 34 (HV Ox) on the substrate 10, and widen the oxide 30/32 spacers. The resulting structures are shown in FIGS. 6A and 6B. As shown in FIG. 6A, the memory area 14 includes pairs of memory stack structures S1 and S2, with each stack including nitride block 26 on buffered oxide 24, which is on poly block 22, which is on oxide 20, which is on substrate 10. For each memory stack pair, the area between memory stacks S1 and S2 is referred to herein as the inner region 36, and the areas outside of memory stacks S1 and S2 are referred to as the outer regions 38.

Figure 7A:
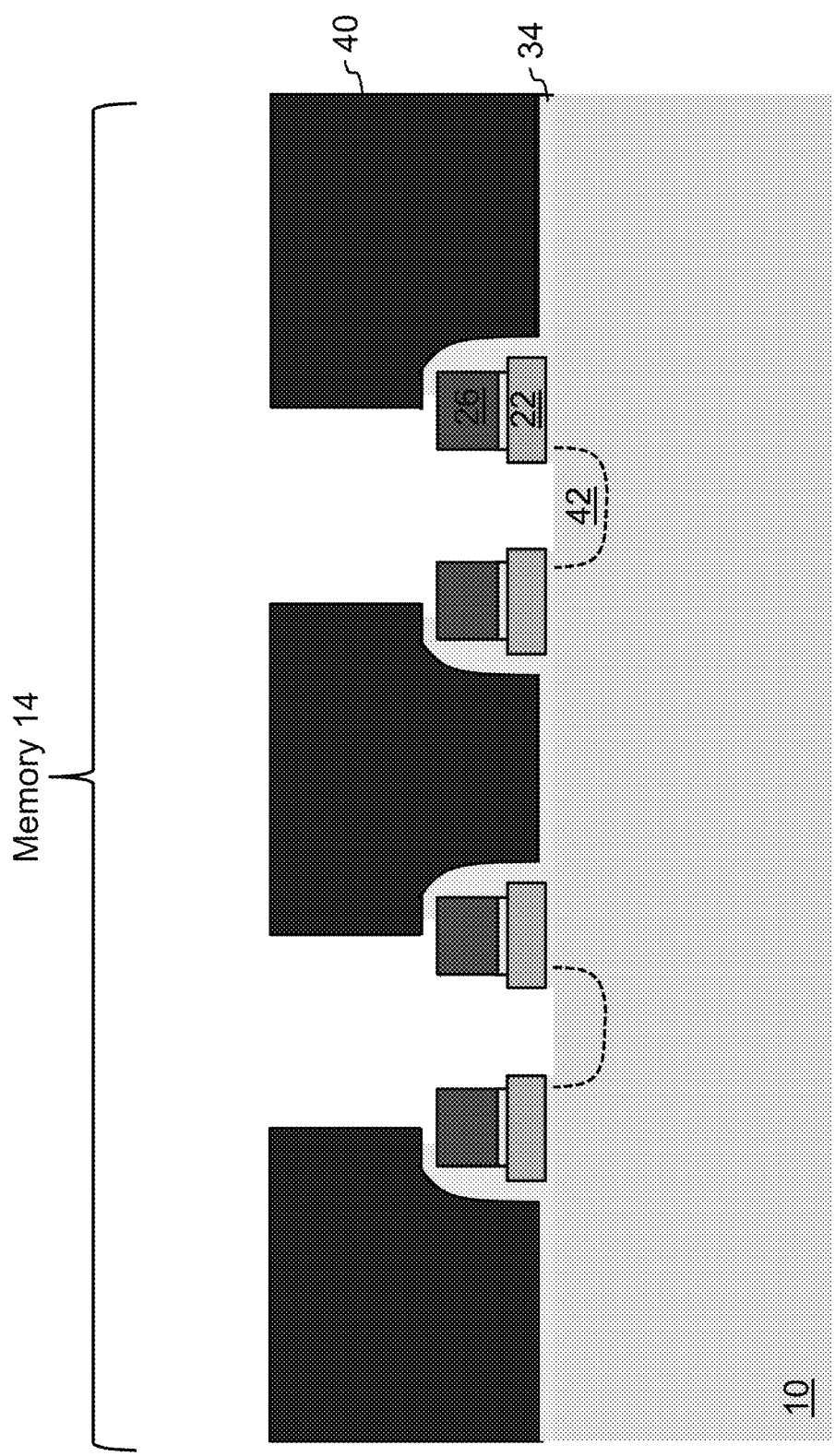
Figure 7B:
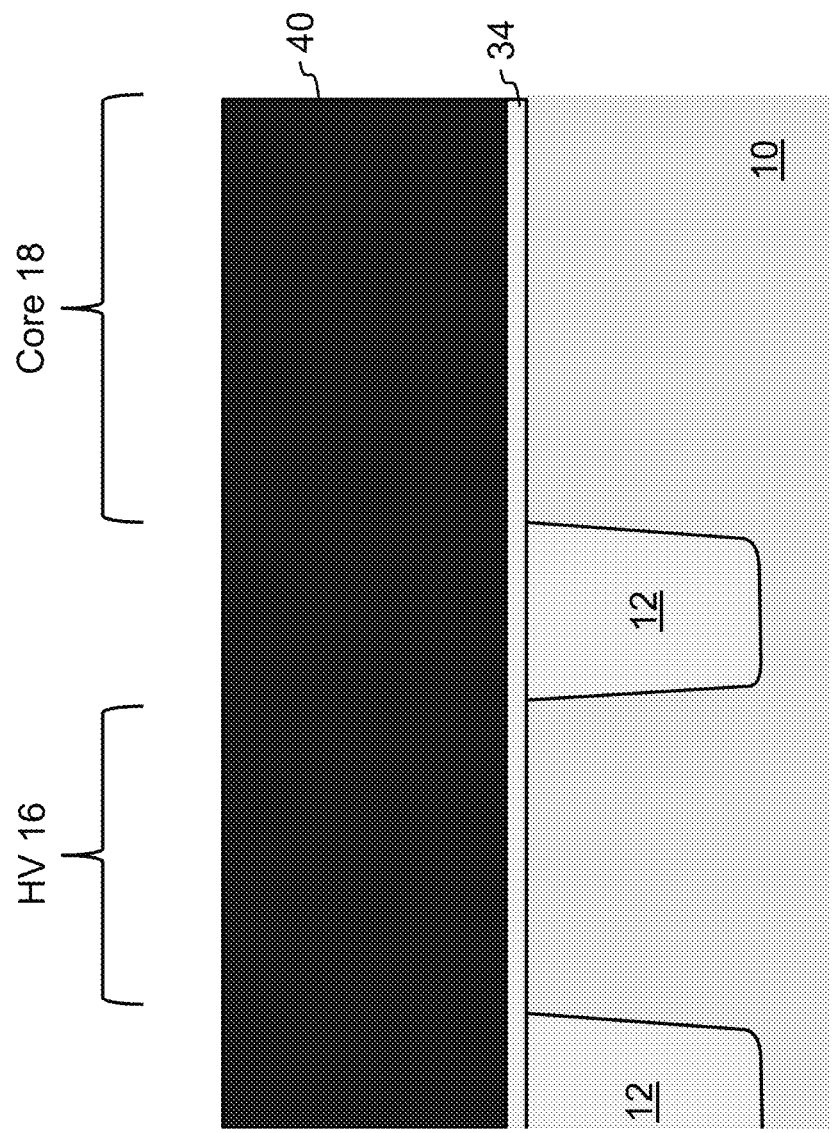
Figure 8A:
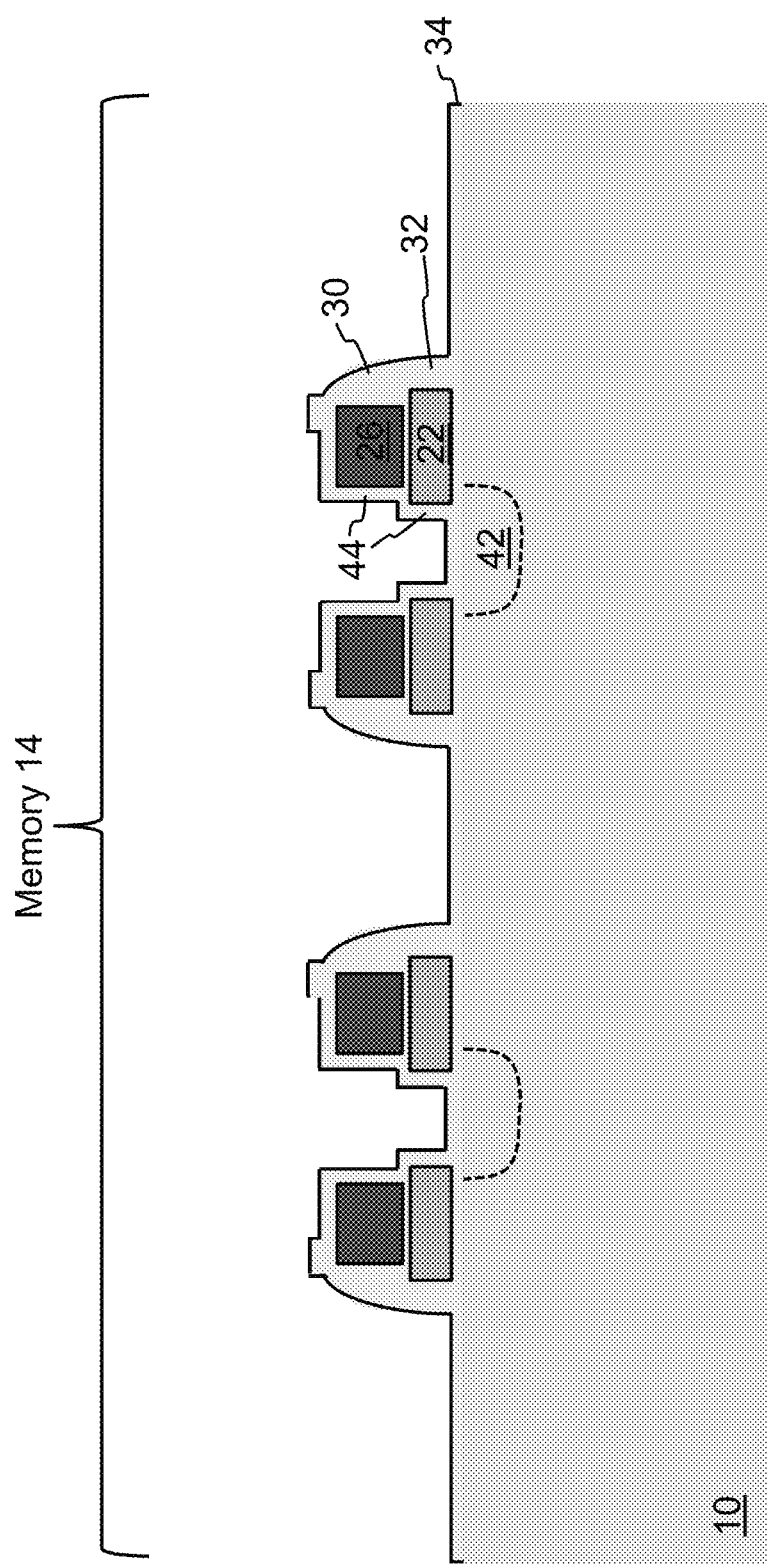

Another masking step is performed, this time to cover the structure with photo resist 40 except for the inner regions 36 of the memory cell area 14. An implantation (HVII) is performed in the substrate in the inner regions 36 (which will form source regions 42 after photo resist removal and thermal annealing). An oxide etch is then used to remove the oxide spacers 30 and oxide layer 34 in the inner regions, as shown in FIGS. 7A and 7B. A tunnel oxide layer 44 is formed on the substrate 10 and along the exposed surfaces of the poly blocks 22 in the inner regions (e.g., by HTO). The photo resist 40 is then removed, leaving the structures in FIGS. 8A and 8B.

Figure 9A:
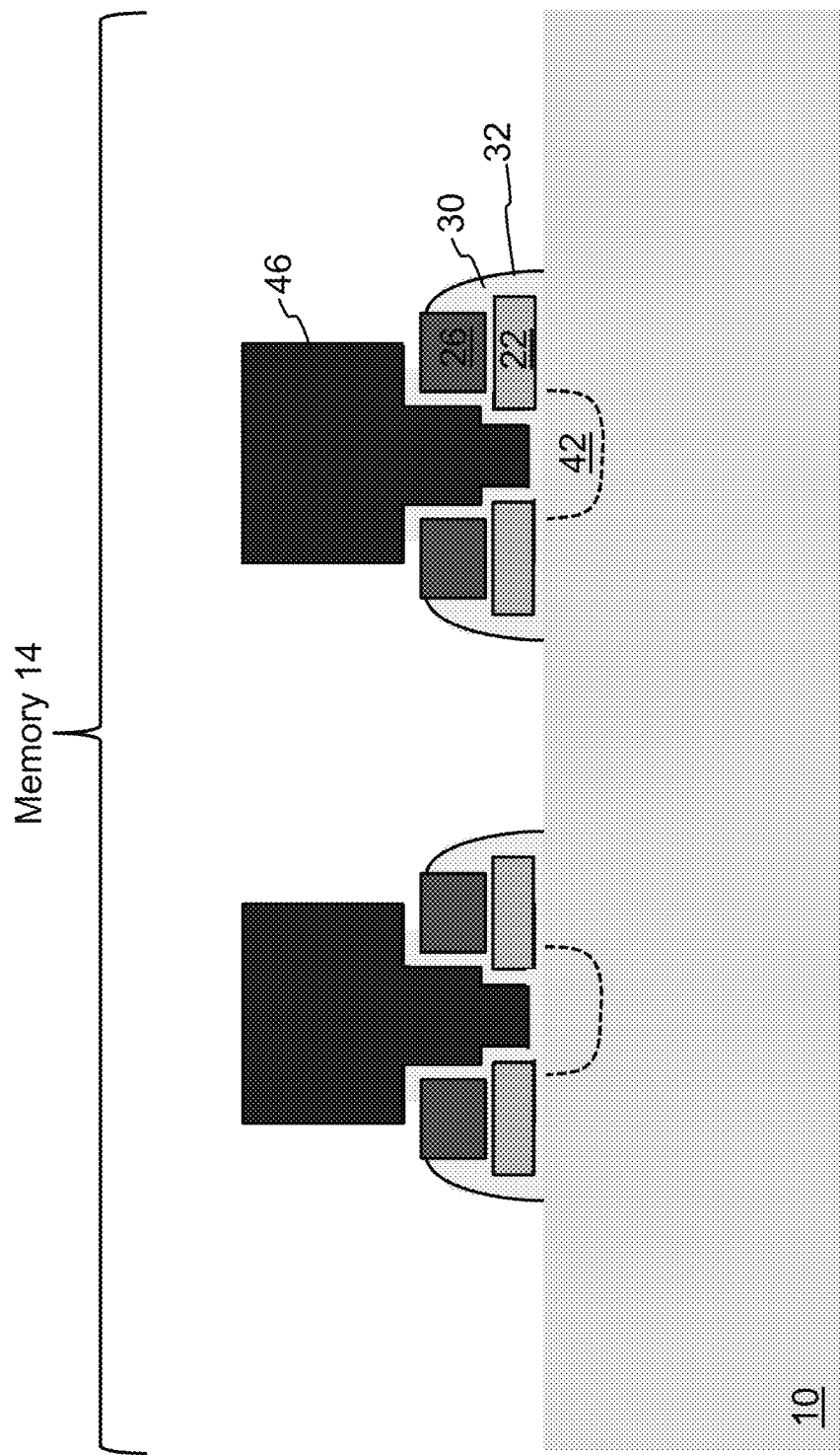
Figure 9B:
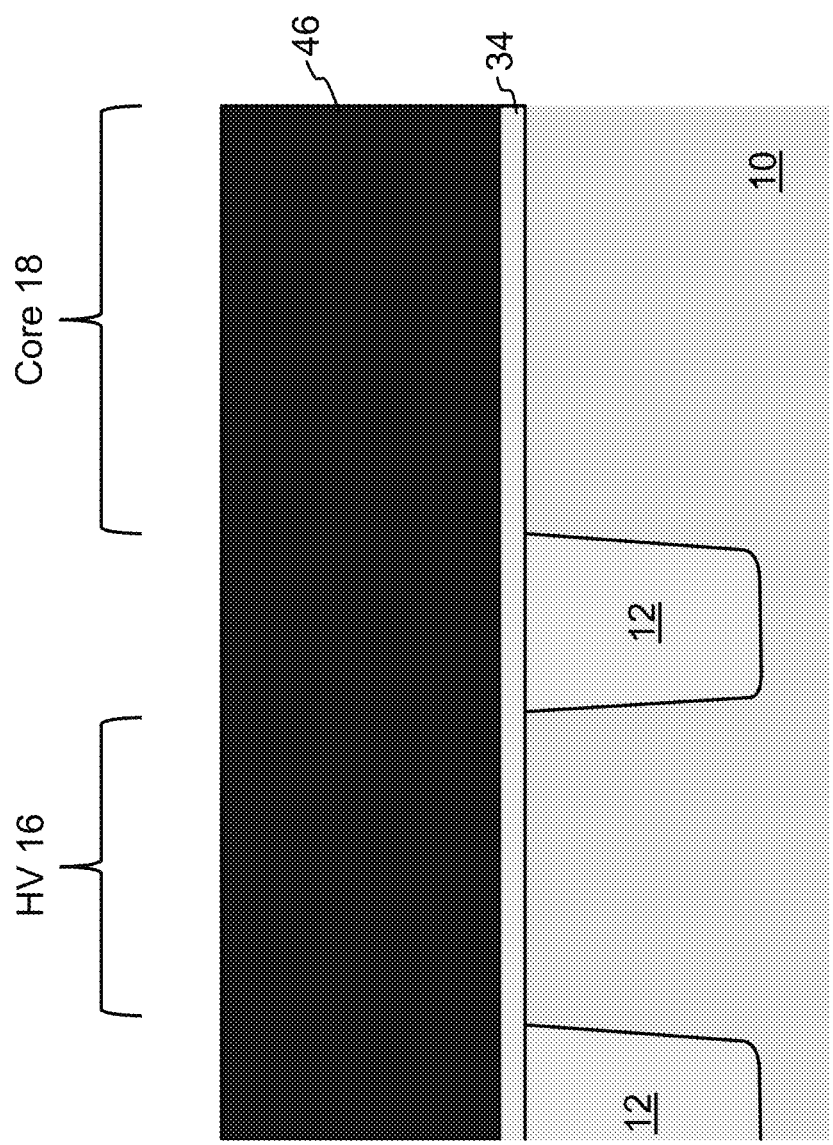
Figure 10B:
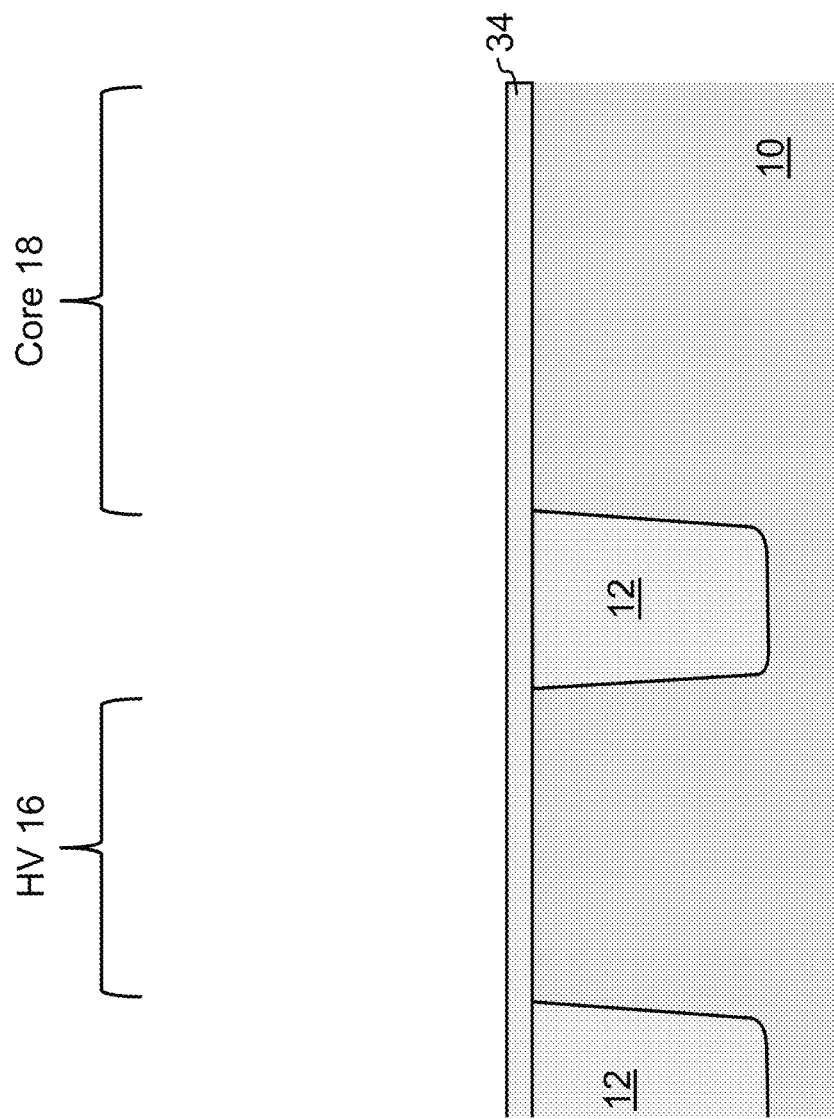

A masking step is used to cover the structures with photo resist 46 except for the outer regions 38 of the memory cell area 14. An appropriate implantation into the substrate in the outer regions can be performed at this time. An oxide etch is then used to remove the oxide layer 34 and thin the oxide spacers 30/32 in the outer regions, as shown in FIGS. 9A and 9B. A layer of oxide (word line oxide) 48 is formed on the substrate in the outer regions. The oxide layer 48 can have a thickness appropriate for 1.1-1.2V, 1.8V, 3.3V or 5V word line operation. The photoresist 46 is then removed, leaving the structures shown in FIGS. 10A and 10B.

Figure 11B:
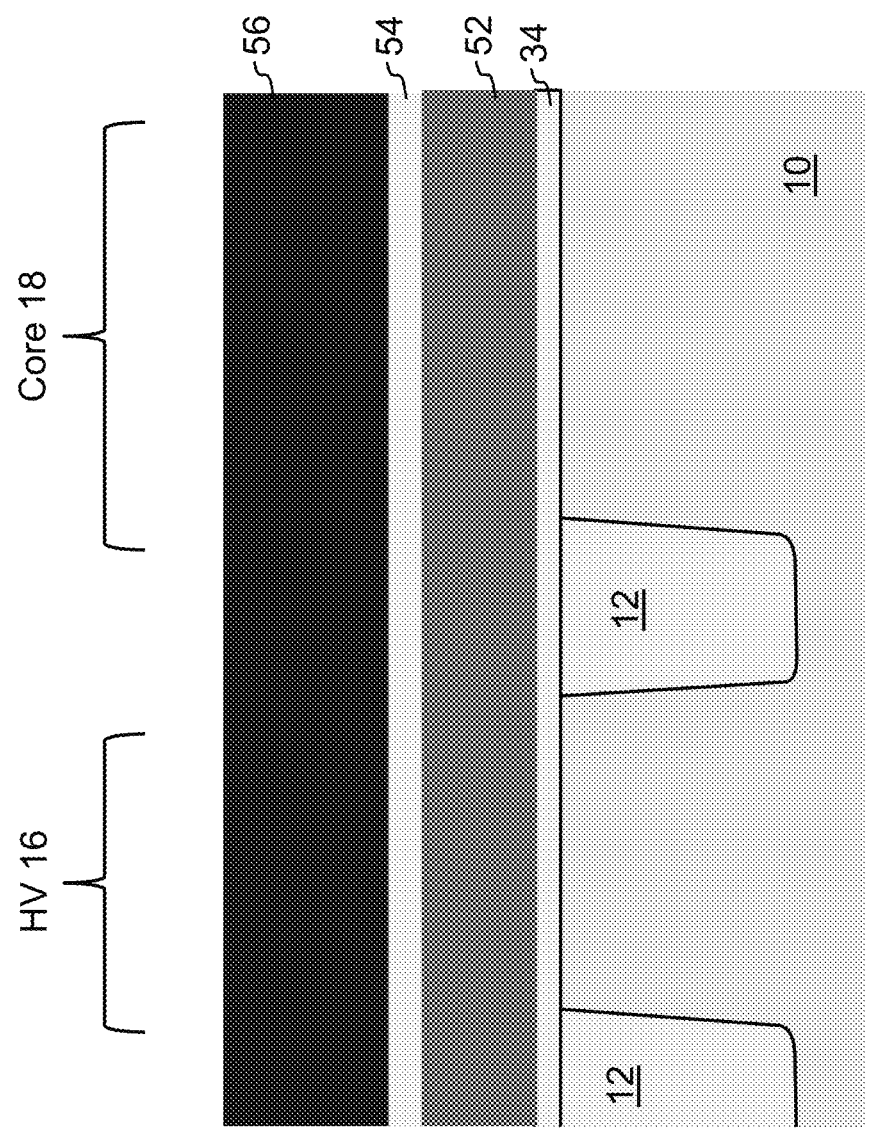
Figure 12A:
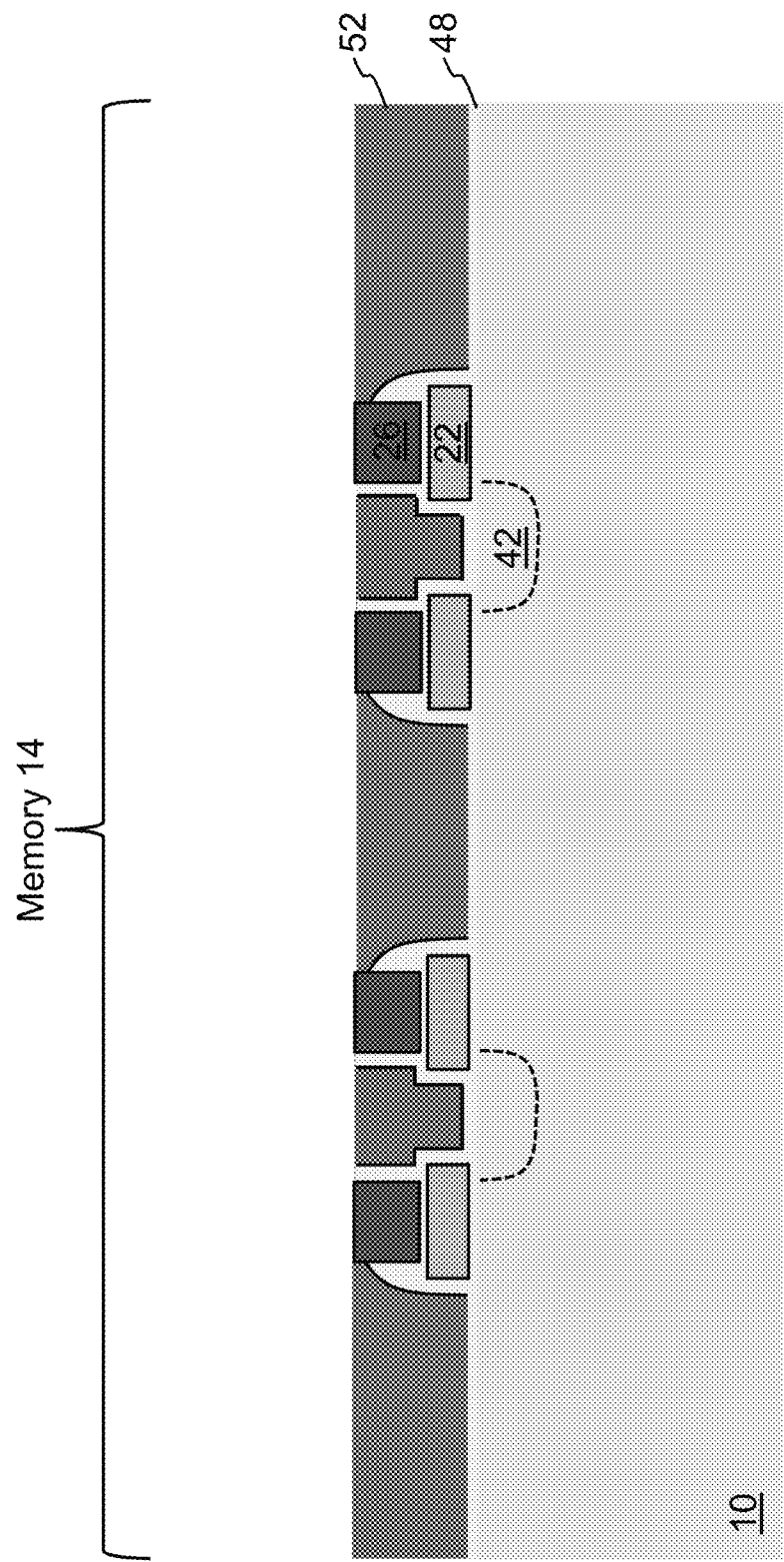
Figure 12B:
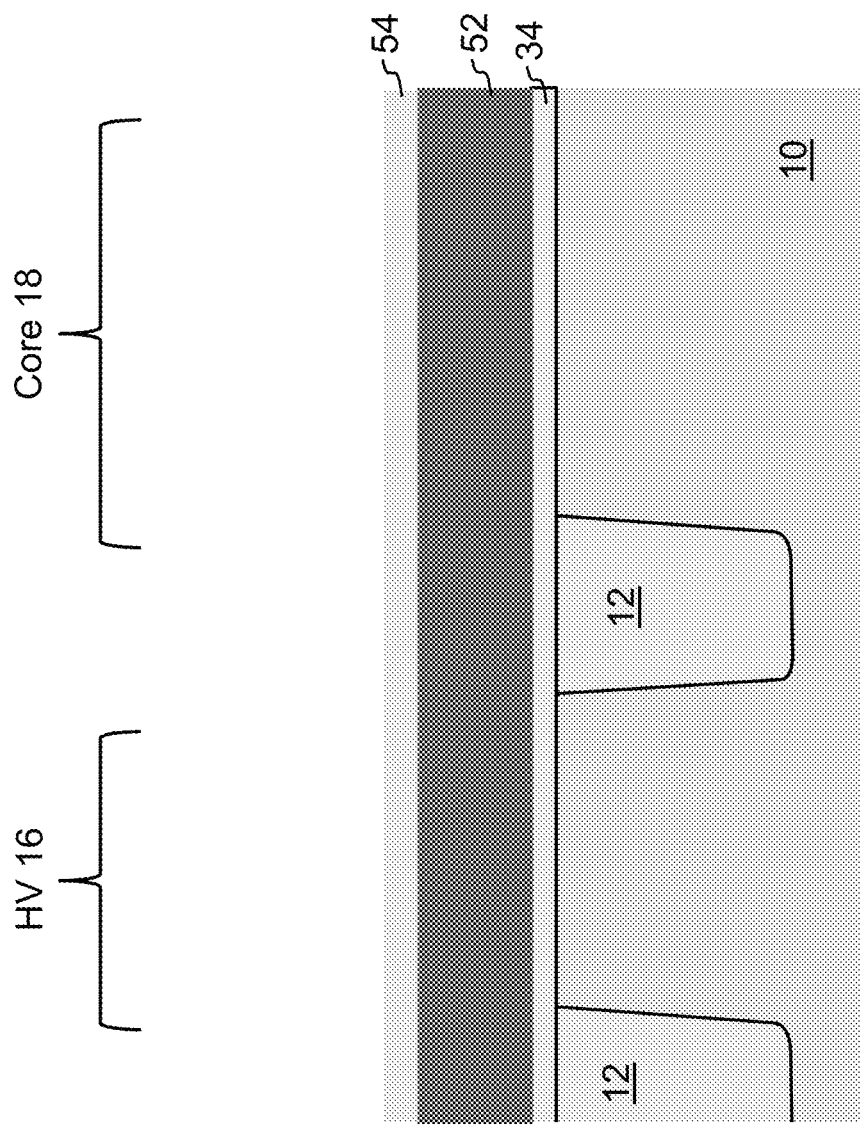

A layer of polysilicon (poly) 52 is deposited on the structure. A layer of oxide (Cap Ox) 54 is formed on poly 52. A masking process is used to form photo resist 56 in the HV and core areas 16/18, but not the memory cell area 14. An oxide etch is then used to remove the oxide layer 54 from the memory cell area 14, as shown in FIGS. 11A and 11B. After photo resist 56 is removed, a polysilicon CMP (chemical mechanical polish) is performed to planarize the top surface of the poly layer 52 in the memory cell area 14 (using oxide layer 54 in the HV/core areas 16/18 as a CMP stop), as shown in FIGS. 12A and 12B. Oxide layer 54 protects poly layer 52 in the HV/core areas 16/18.

Figure 13A:
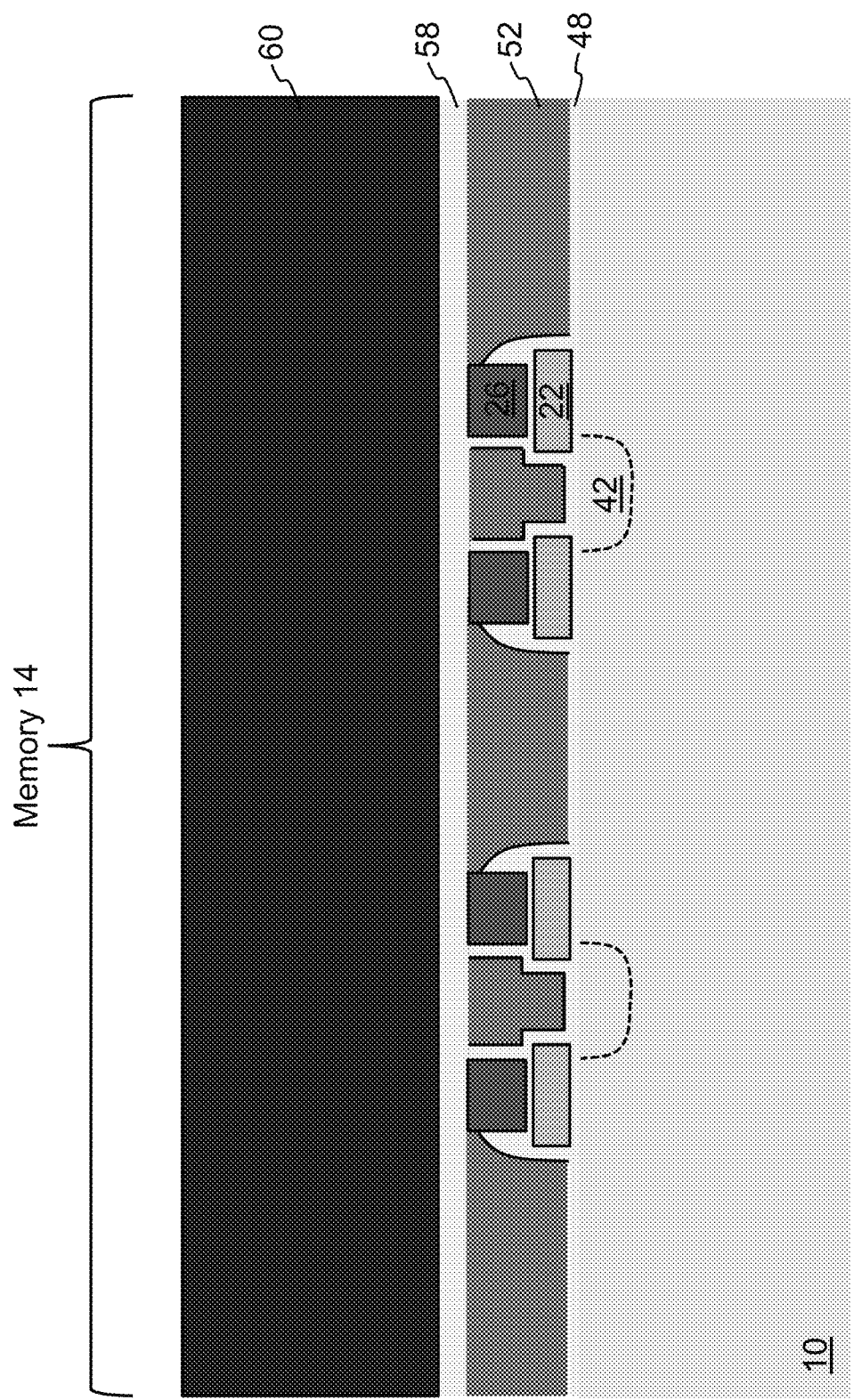
Figure 13B:
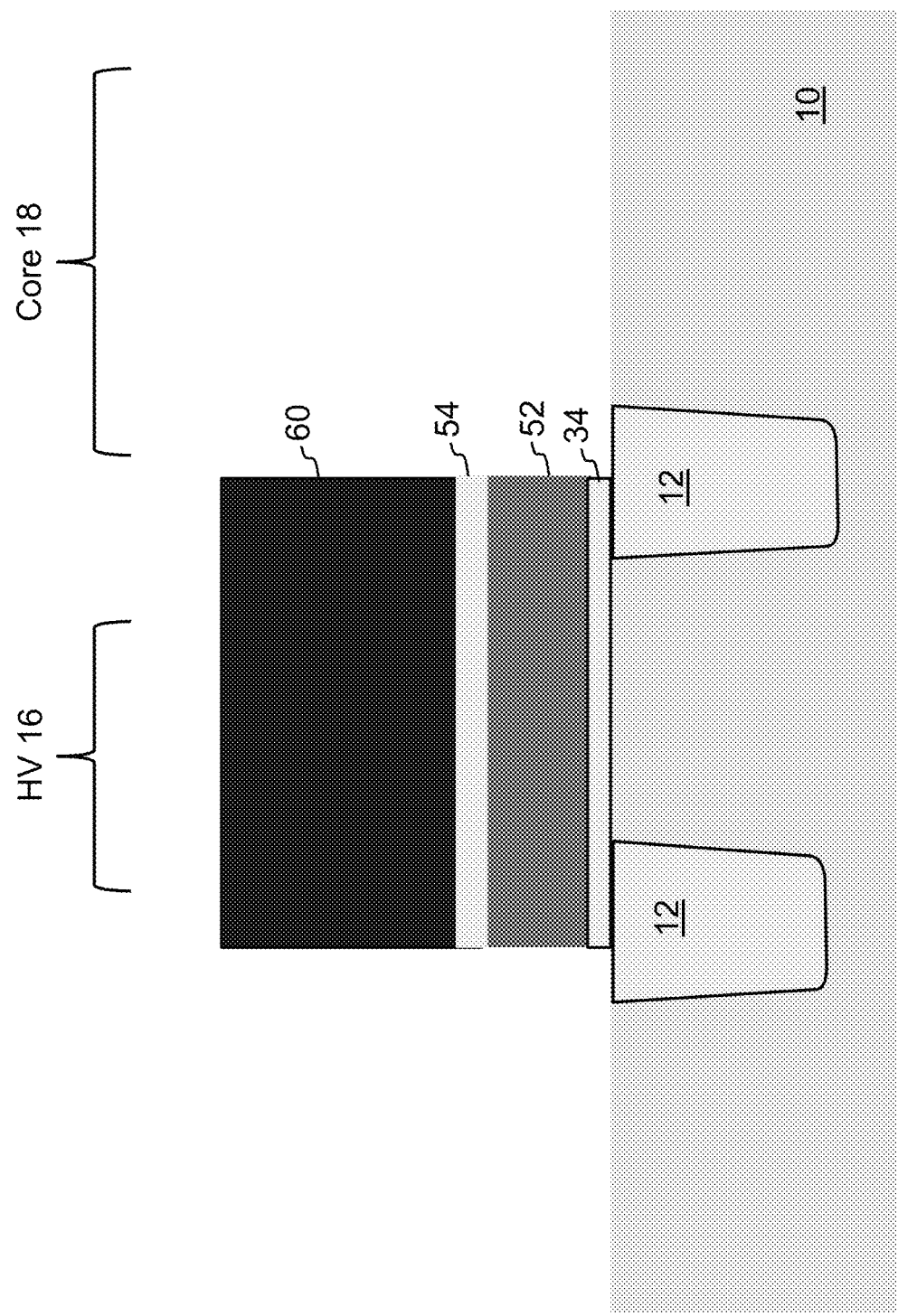
Figure 14A:
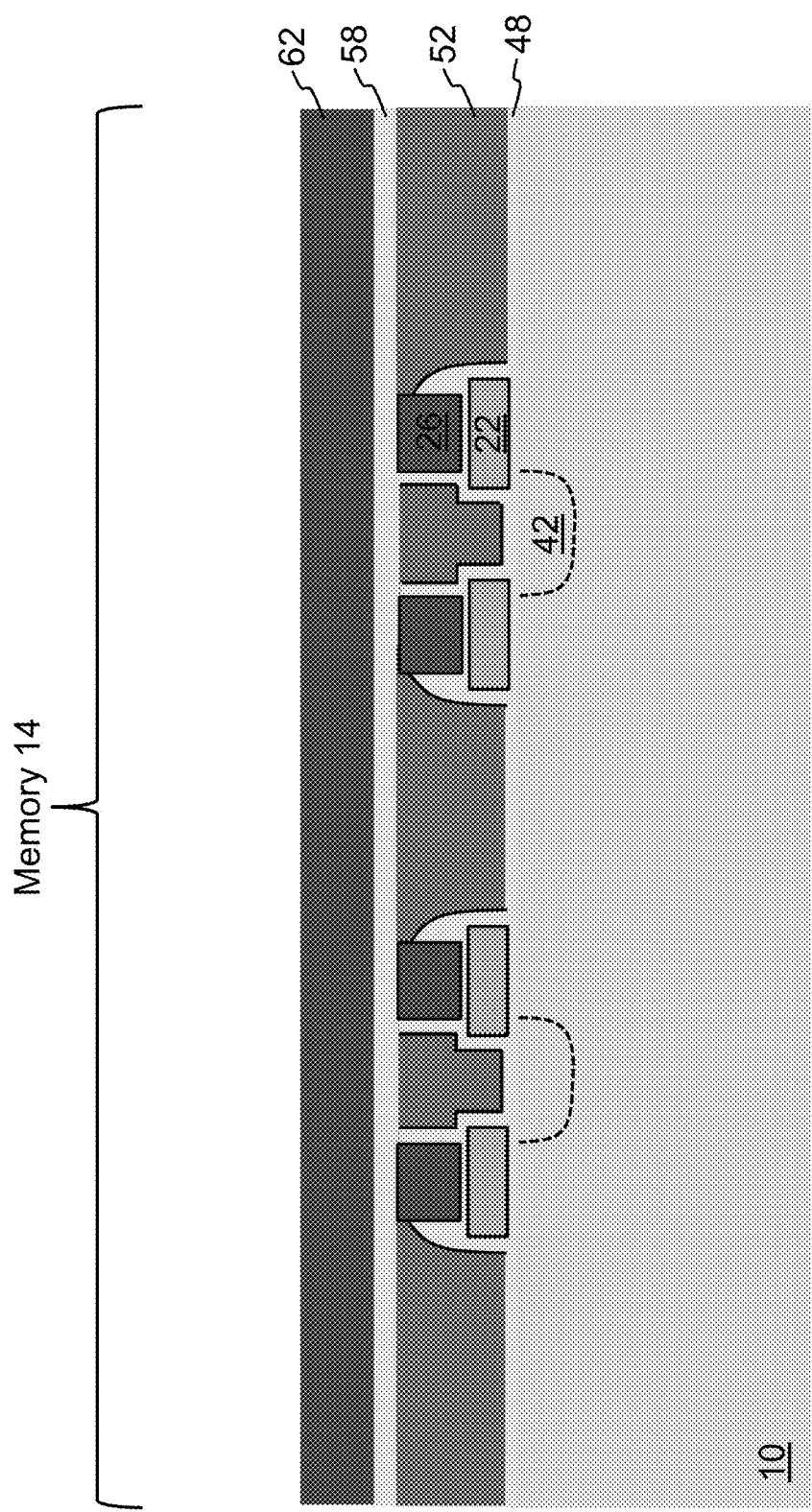
Figure 14B:
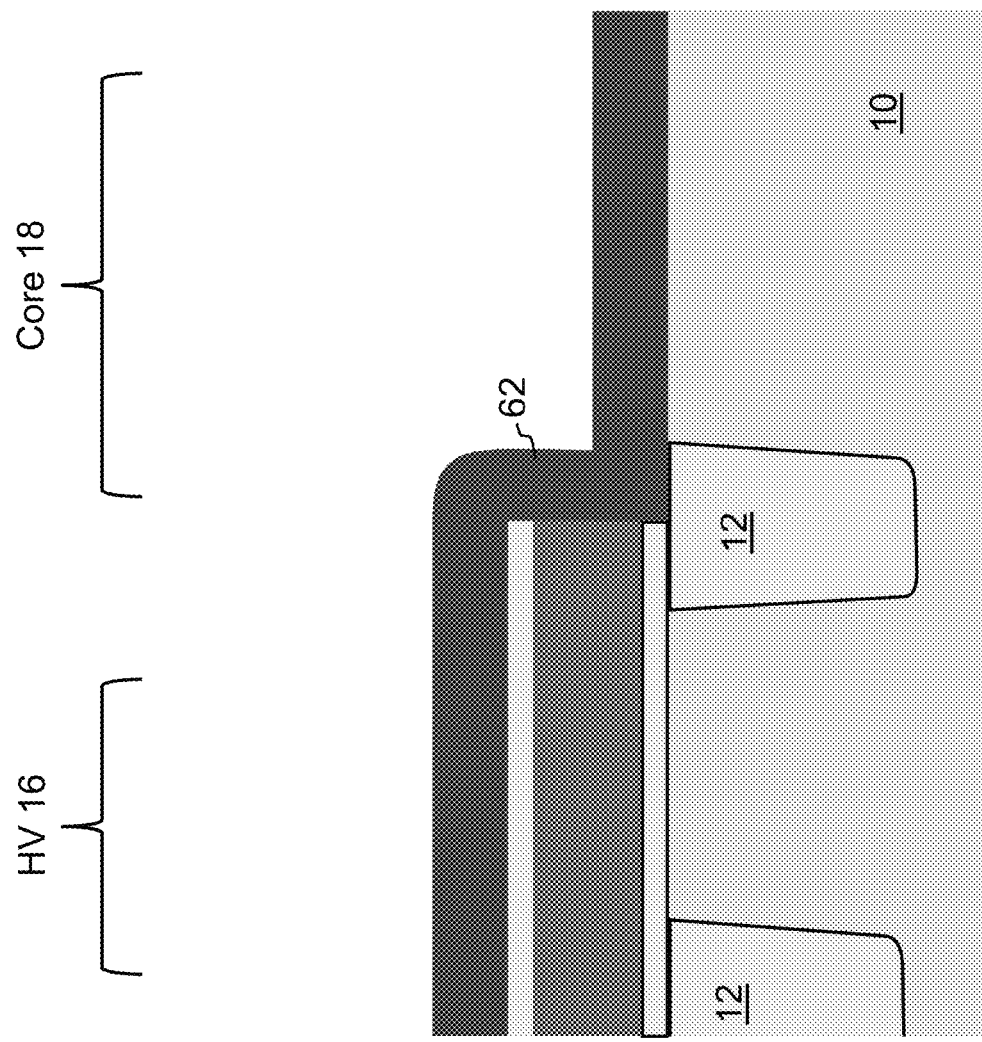

An oxide etch is performed to remove the oxide layer 54 from the HV/core areas 16/18. An oxide layer (blocking oxide) 58 is next formed over the structure. A masking step is performed to form photo resist 60 on the blocking oxide 58 except for in the core area 18. Oxide and poly etches are performed to remove all the layers in the core area 18 (in preparation for FinFET device formation), as shown in FIGS. 13A and 13B. After photo resist 60 is removed, a layer of silicon nitride (nitride) 62 is formed over the structure, as shown in FIGS. 14A and 14B.

A masking process is used to form thin blocks of photo resist 64 in the core area 18, while covering the entirety of the memory cell and HV areas 14/16. A nitride etch is used to remove exposed portions of the nitride layer 62 in the core area 18 only, leaving thin fins of the nitride 62a as shown in FIG. 15. While the fin patterns are formed using photolithography, they alternately could be formed using self-aligned double patterning (SADP) or sidewall image transfer (SIT). After photo resist 64 is removed, a silicon etch is then used to etch the exposed surfaces of the substrate 10 in the core area 18 (between nitride fins 62a, using the nitride 62 as a hard mask), leaving fins of silicon 10a. The silicon fins may be formed by dry etching or wet etching, such as TMAH (tetramethylammonium hydroxide). The resulting structure in the core area 18 is shown in FIG. 16.

Oxide 66 is formed on the structure, filling the area between the silicon fins 10a. Preferably, a TEOS oxide deposition, followed by CMP using the nitride 62 as a CMP stop is used to form the oxide 66. A wet or dry oxide etch is used to recess the oxide 66 well below the tops of the silicon fins 10a. The oxide 66 provides isolation between the fins 10a. An anti-punch-through implantation is performed between fins 10a and the border between core and non-core areas, as shown in FIG. 17.

Figure 18:
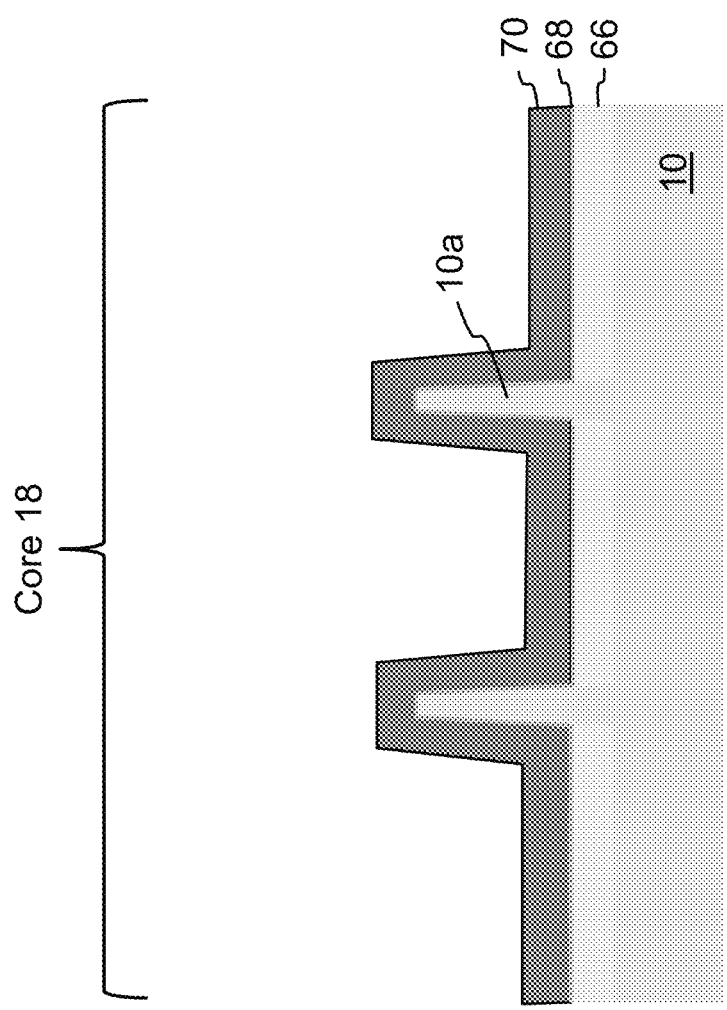

A nitride etch (e.g. hot phosphoric acid $H_3PO_4$) is used to remove the nitride layer 62 in all areas. A high-K metal gate layer (HKMG) is formed on the structure. This layer has a high-K dielectric layer (HK) 68 formed first (i.e. having a dielectric constant K greater than that of oxide, such as HfO2, ZrO2, TiO2, Ta2O5, or other adequate materials, etc.), followed by a metal layer (MG) 70 formed by metal deposition. The high-K dielectric is preferably formed using atomic layer deposition (ALD). The high-K dielectric and metal gate are removed from memory and HV areas 14/16 by using a masking step to cover the core area 18 with photo resist and then performing dry etching. The resulting structure in the core area 18 is illustrated in FIG. 18.

Figure 19A:
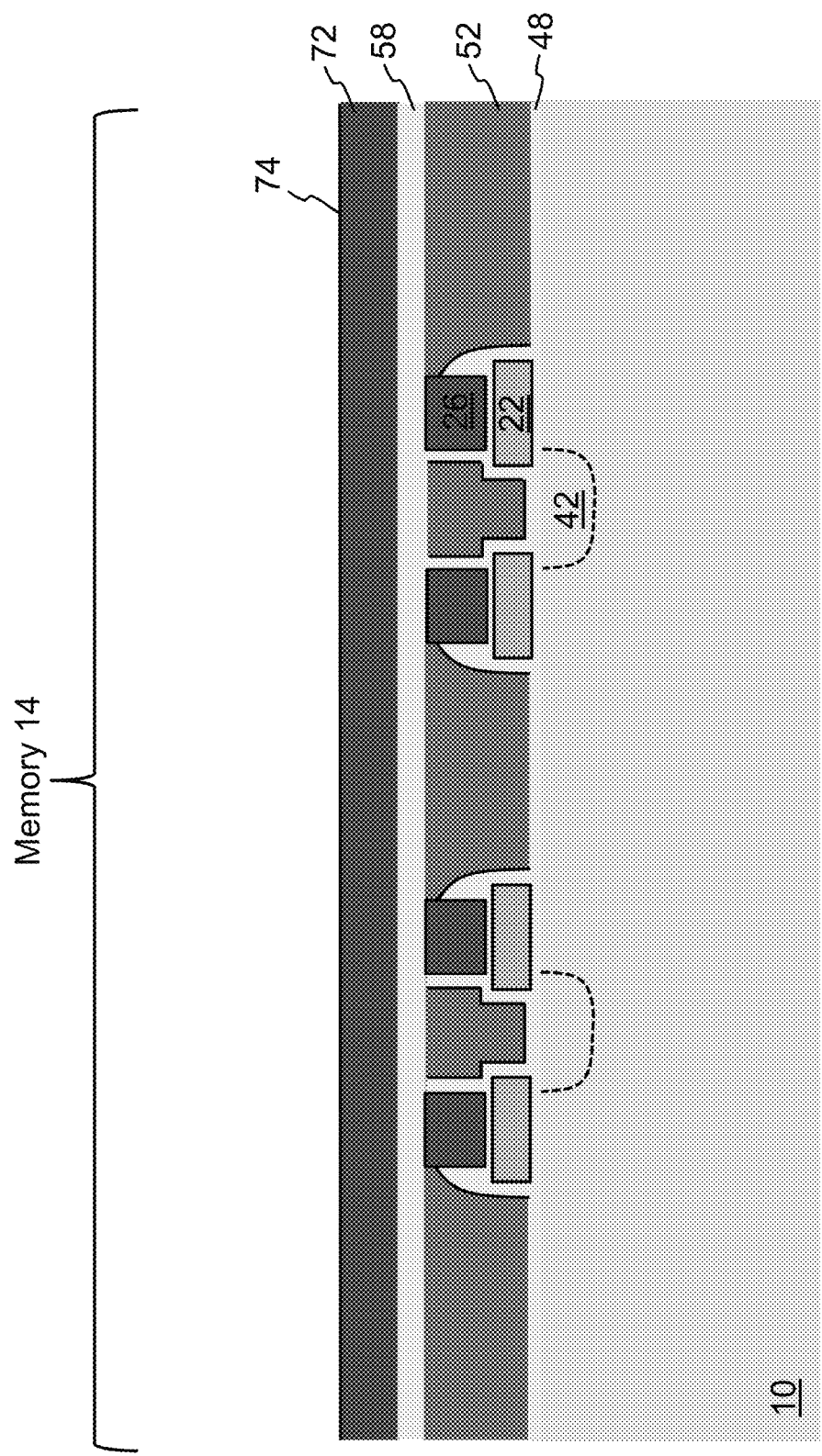
FIGS. 19A-19C are side cross sectional views of the memory area and core area of the substrate, illustrating further steps in the formation of memory cells and logic devices therein.
Figure 19B:
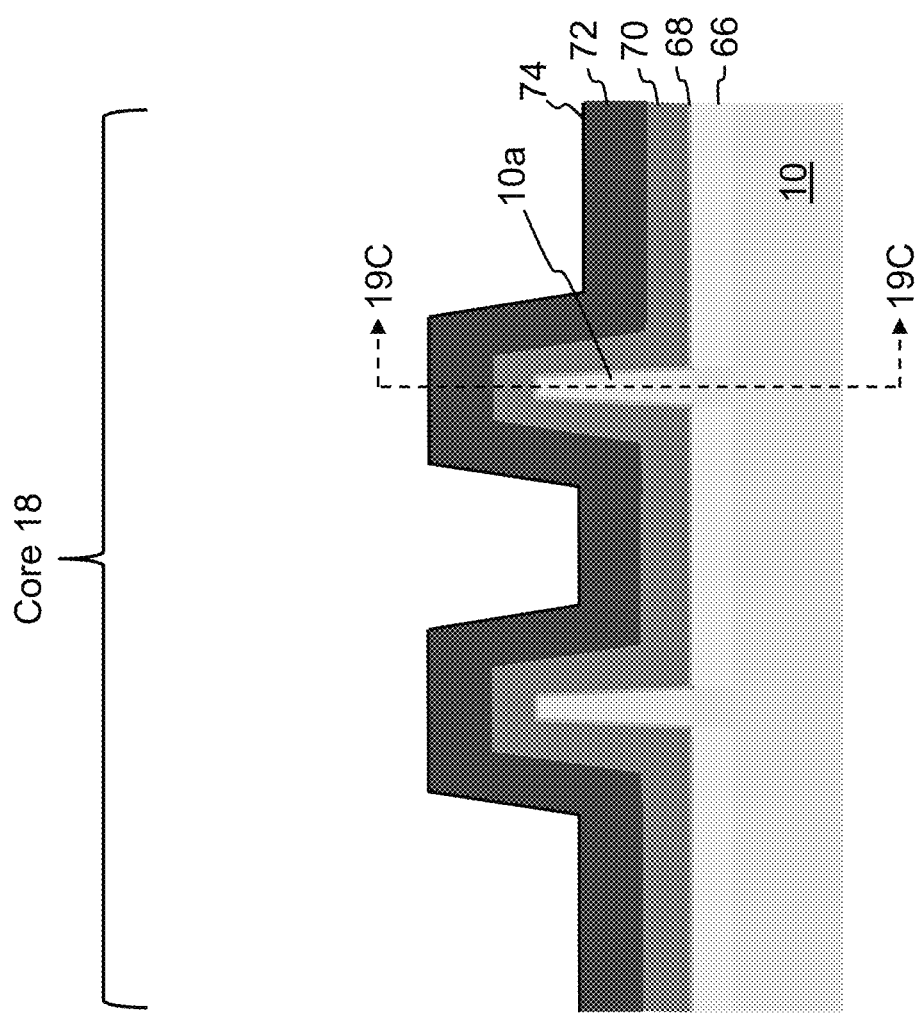
Figure 19C:
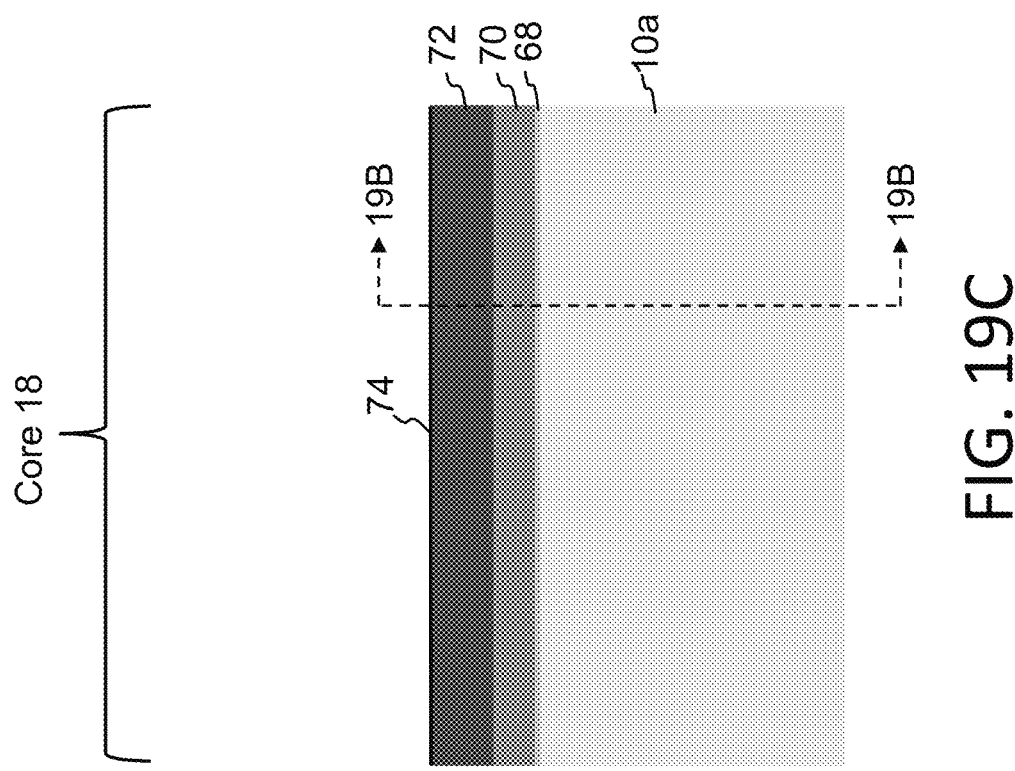

A nitride layer 72 is formed on the structure (as a hard mask for logic gate definition). Amorphous carbon also may be used as a hard mask. A thin layer of DARC (Dielectric Anti-Reflective Coating) is then deposited on the nitride 72 (as an ARC layer for photo-lithography), as illustrated in FIGS. 19A, 19B and 19C.

Figure 20A:
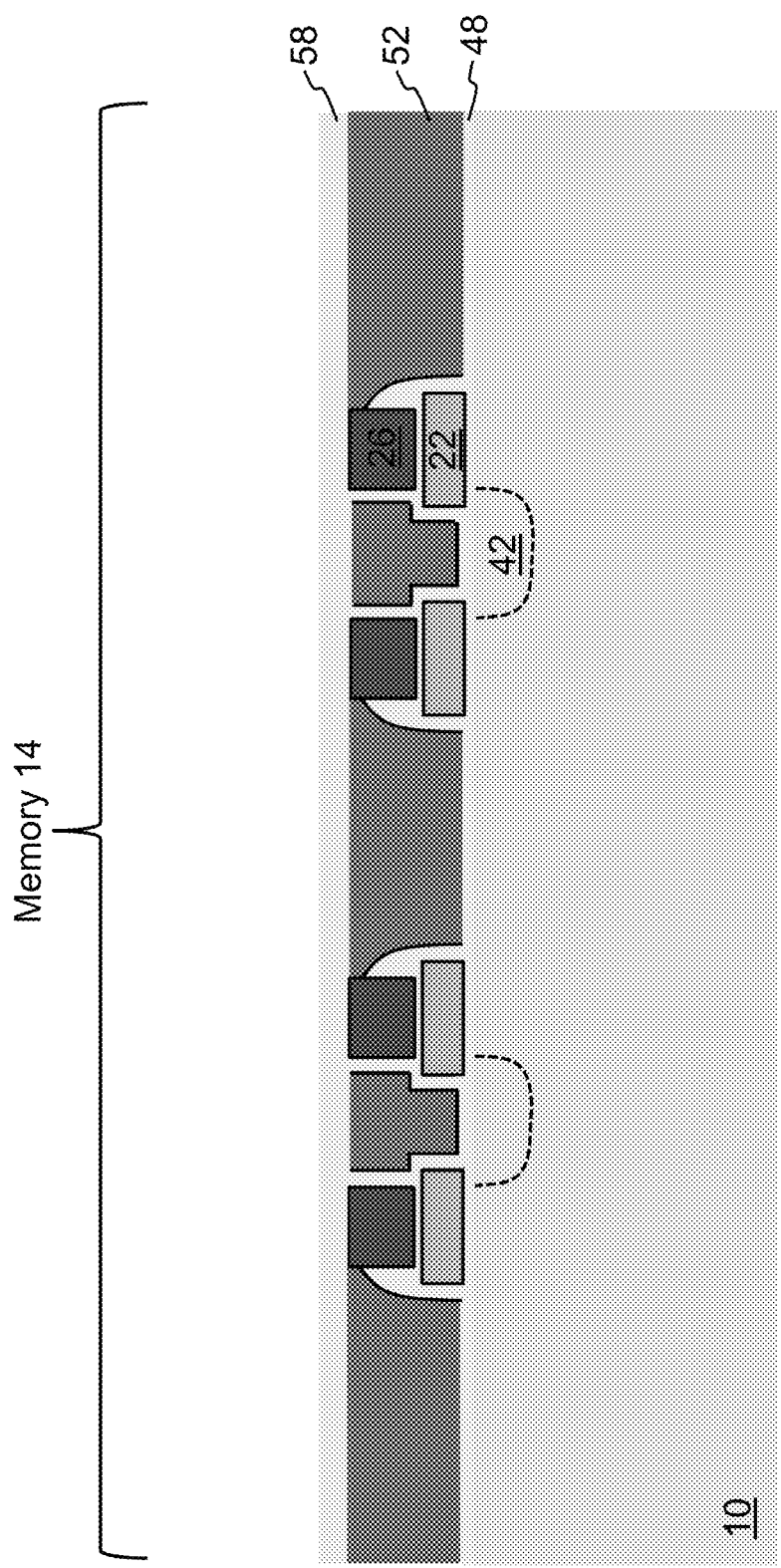
FIGS. 20A-20C are side cross sectional views of the memory, core and HV areas of the substrate, illustrating further steps in the formation of memory cells and logic devices therein.
Figure 20B:
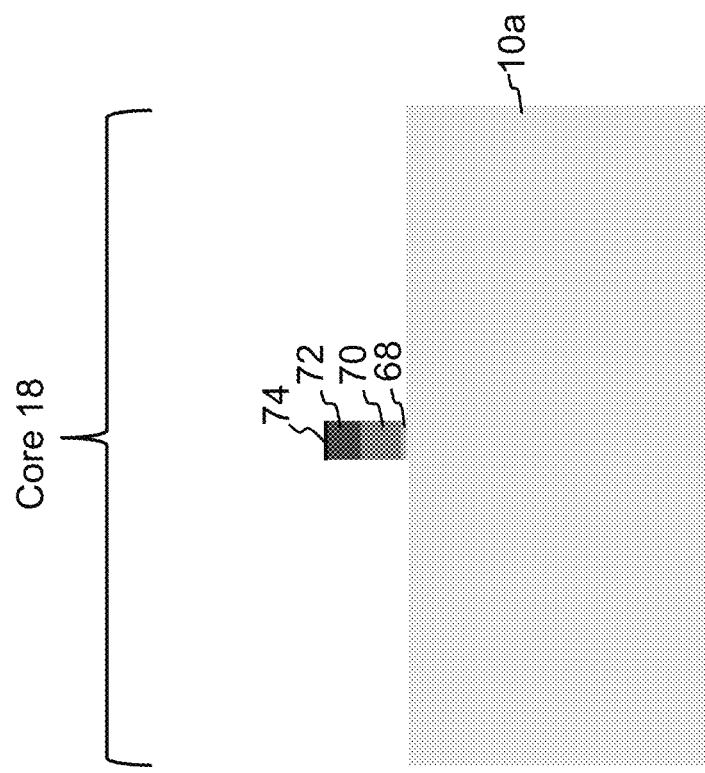
Figure 20C:
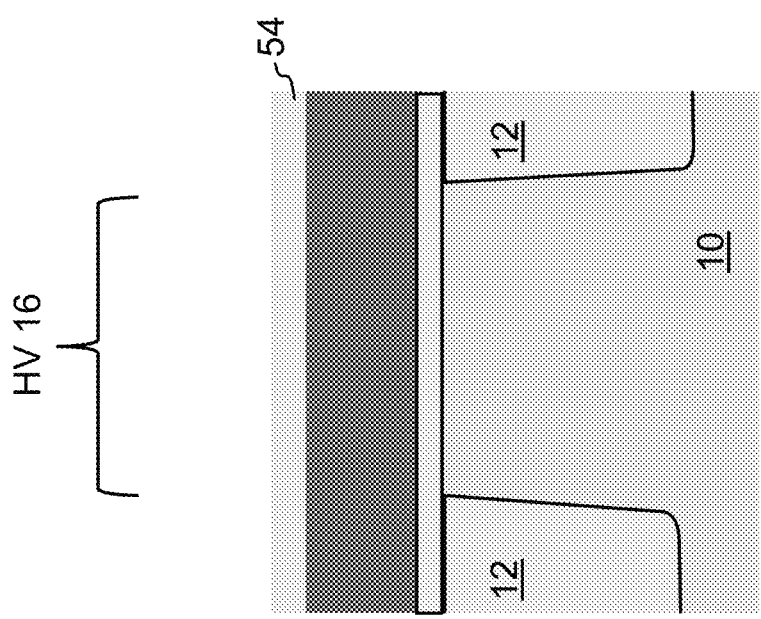

A masking process is used to form blocks of photo resist on the nitride 72 and DARC 74 in the core area 18. Etching is then performed to remove exposed portions of the nitride 72 and DARC 74 and HKMG layers 68/70 in the core area 18, leaving blocks of the metal 70 as logic gates. The etching will also remove the nitride 72 and DARC 74 in the memory cell area 14 (using the blocking oxide 58 as an etch stop) and from the HV area 16 (using oxide 54 as an etch stop). FIGS. 20A and 20B and 20C show the resulting structures after the removal of the photo resist.

Figure 21A:
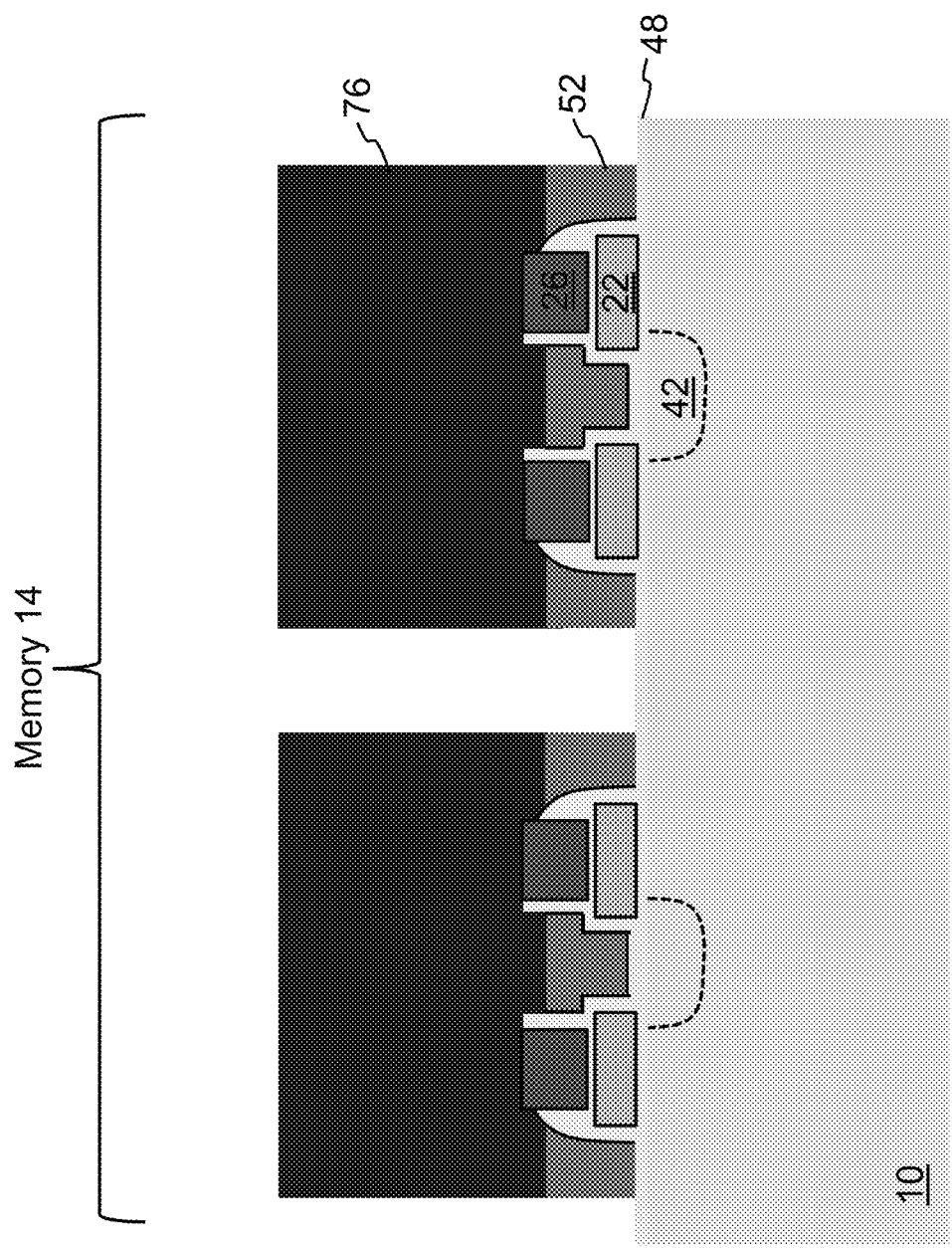
FIGS. 21A-21B are side cross sectional views of the memory area and HV area of the substrate, illustrating further steps in the formation of memory cells and logic devices therein.
Figure 21B:
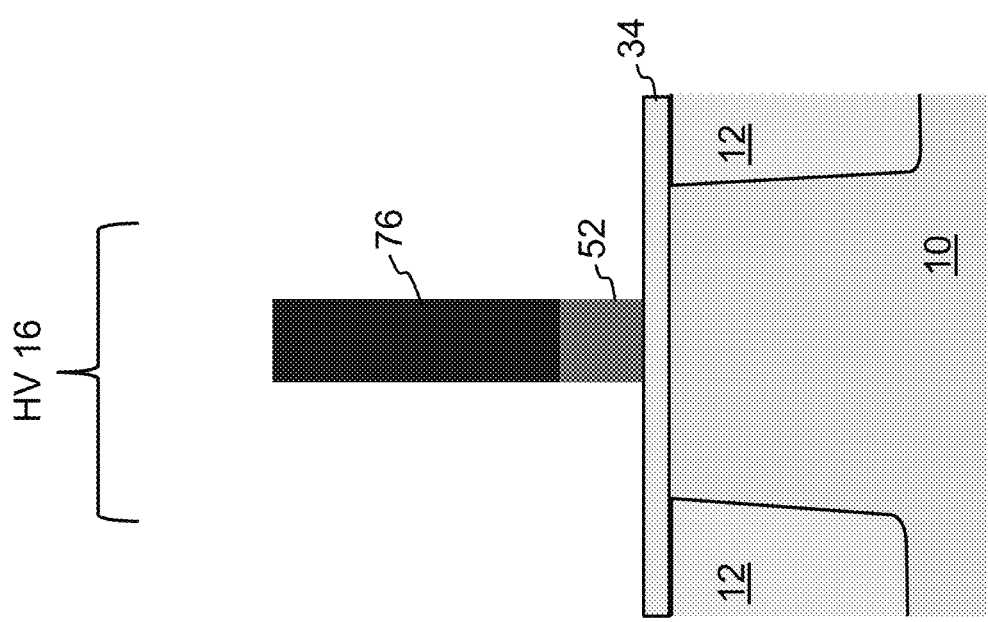

A masking step is used to cover the core area 18 with photo resist, and an oxide etch is used to remove the blocking oxide 58 from the memory area 14 and oxide 54 from the HV area 16. A poly etch back is then used to lower (and optimize) the height of the thickness of poly layer 52 in the memory cell area 14 and HV area 16. The photo resist is then removed, and another masking step is used to cover the structure with photo resist 76 except for the outer regions 38 in the memory cell area 14, and selected areas in the HV area 16. A poly etch is then used to etch the exposed portions of poly layer 52, to define the word line (WL) gates 52 in the memory cell area 14, and logic gates 52 in the HV area 16, as shown in FIGS. 21A and 21B.

Figure 22:
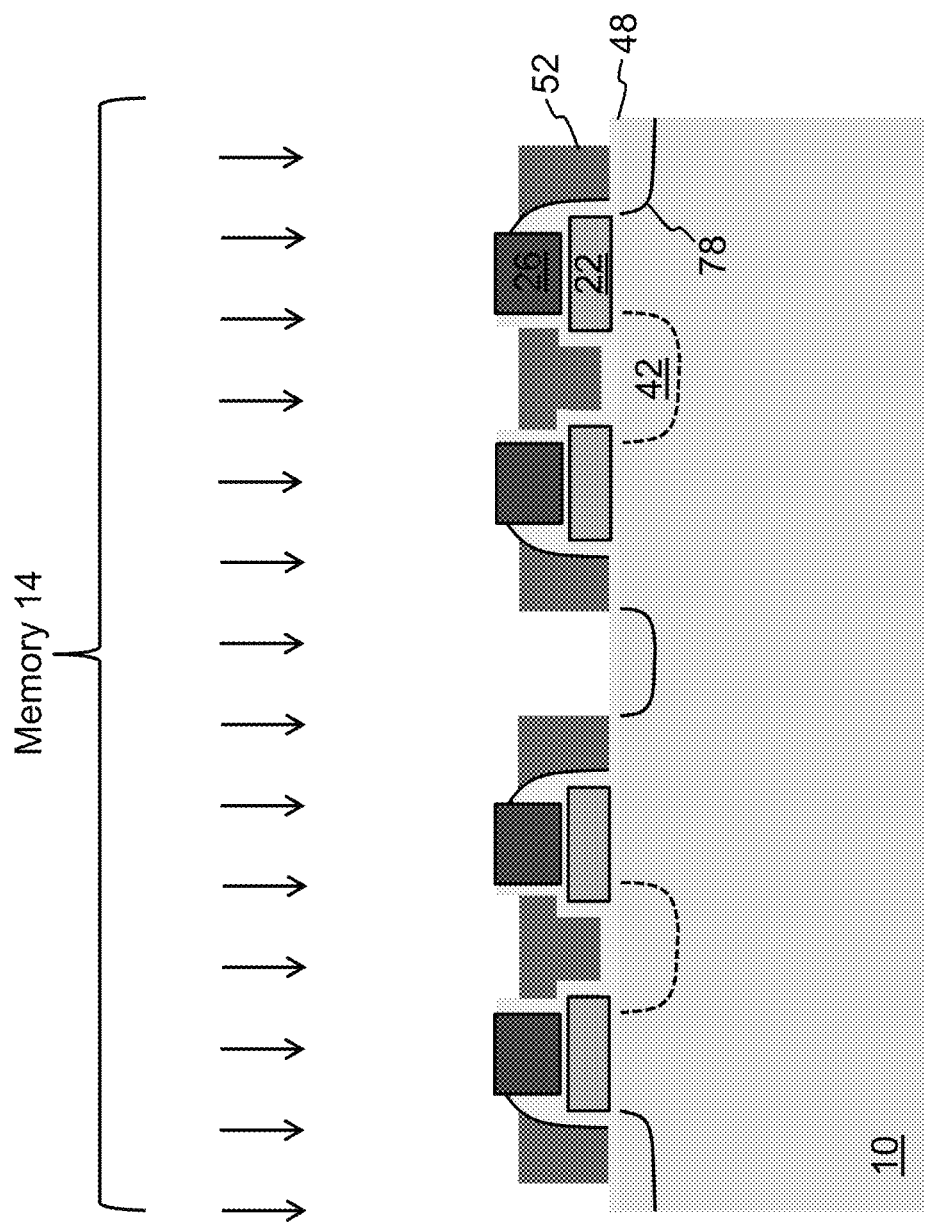
FIG. 22 is a side cross sectional view of the memory area of the substrate, illustrating further steps in the formation of memory cells therein.
Figure 23A:
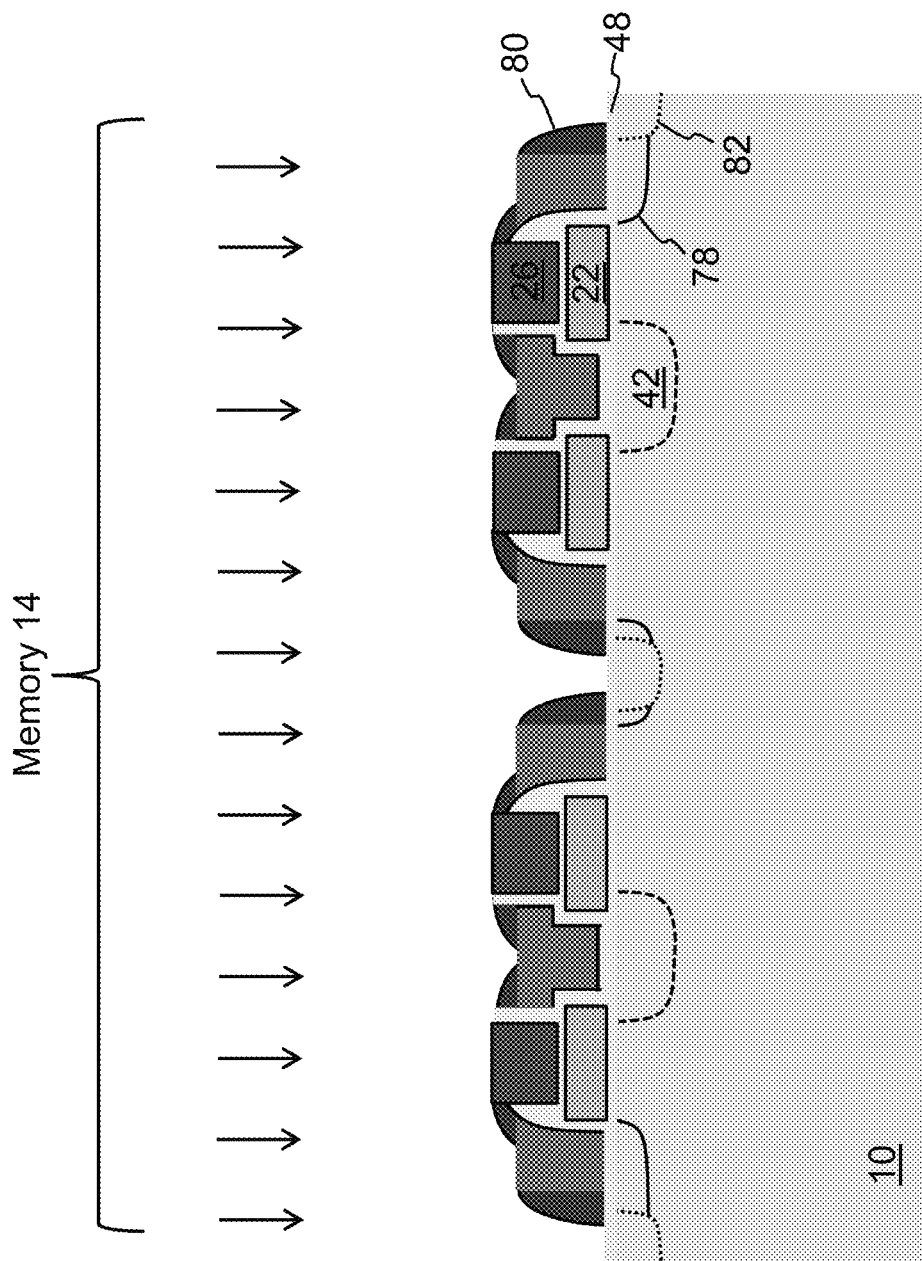
FIGS. 23A-23C are side cross sectional views of the memory, HV and core areas of the substrate, illustrating further steps in the formation of memory cells and logic devices therein.
Figure 23B:
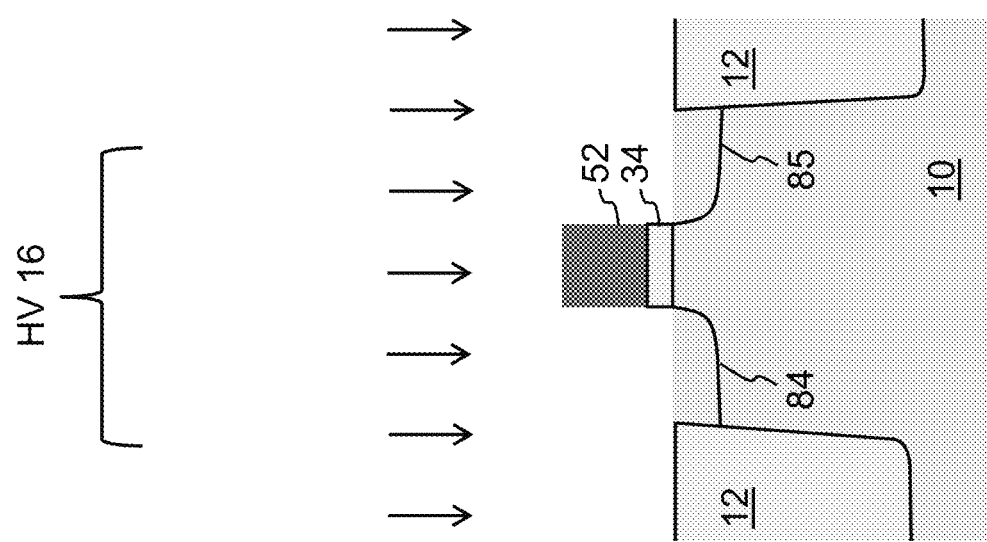
Figure 23C:
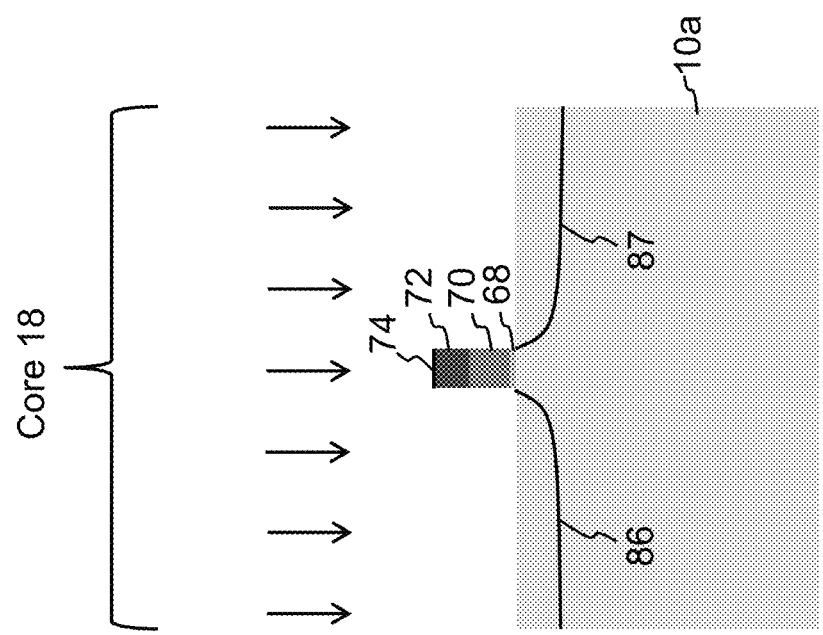

After removal of photo resist 76, a masking step is used to cover the structures with photo resist except the memory cell area 14. An implantation is then used to form MLDD junctions 78, as shown in FIG. 22. For example, an LDD implant allows for BL (N+) junction underlapping the word line WL poly gate 52 with LDD (N−) junction. An anneal is performed after the implant to activate the MLDD junction. Oxide spacers 80 are formed using an oxide deposition and etch. After the photo resist is removed, an implantation is performed to form drain regions 82 in the memory cell area 14 (adjacent the oxide spacers 80), source and drain regions 84 and 85 in the HV area 16, and source and drain regions 86 and 87 in the core area 18, as shown in FIGS. 23A, 23B and 23C. Although a single implantation is preferably used to form memory cell drain regions, and the HV/core source/drain regions, it should be noted that separate implantations can instead be used.

Back end processing is performed to form insulation 88 (e.g., inter-layer dielectric ILD) over structure, electrical contacts 90 extending through the ILD 88 to the memory cell drain regions 82, and a metal bit line 92 connecting together all the electrical contacts for each column of memory cells. Optional silicide 94 can be formed on the surface area of the drain regions 82 (silicide is not preferred on poly 52 as it may degrade the quality of the tunnel oxide and isolation between floating and word line gate). Similar contacts (not shown) can be formed for the source/drain regions in the HV/core areas 16/18 as needed. The resulting memory cell area structure is shown in FIG. 24A, the resulting HV area structure is shown in FIG. 24B, and the resulting core area structure is shown in FIGS. 24C and 24D.

Figure 24A:
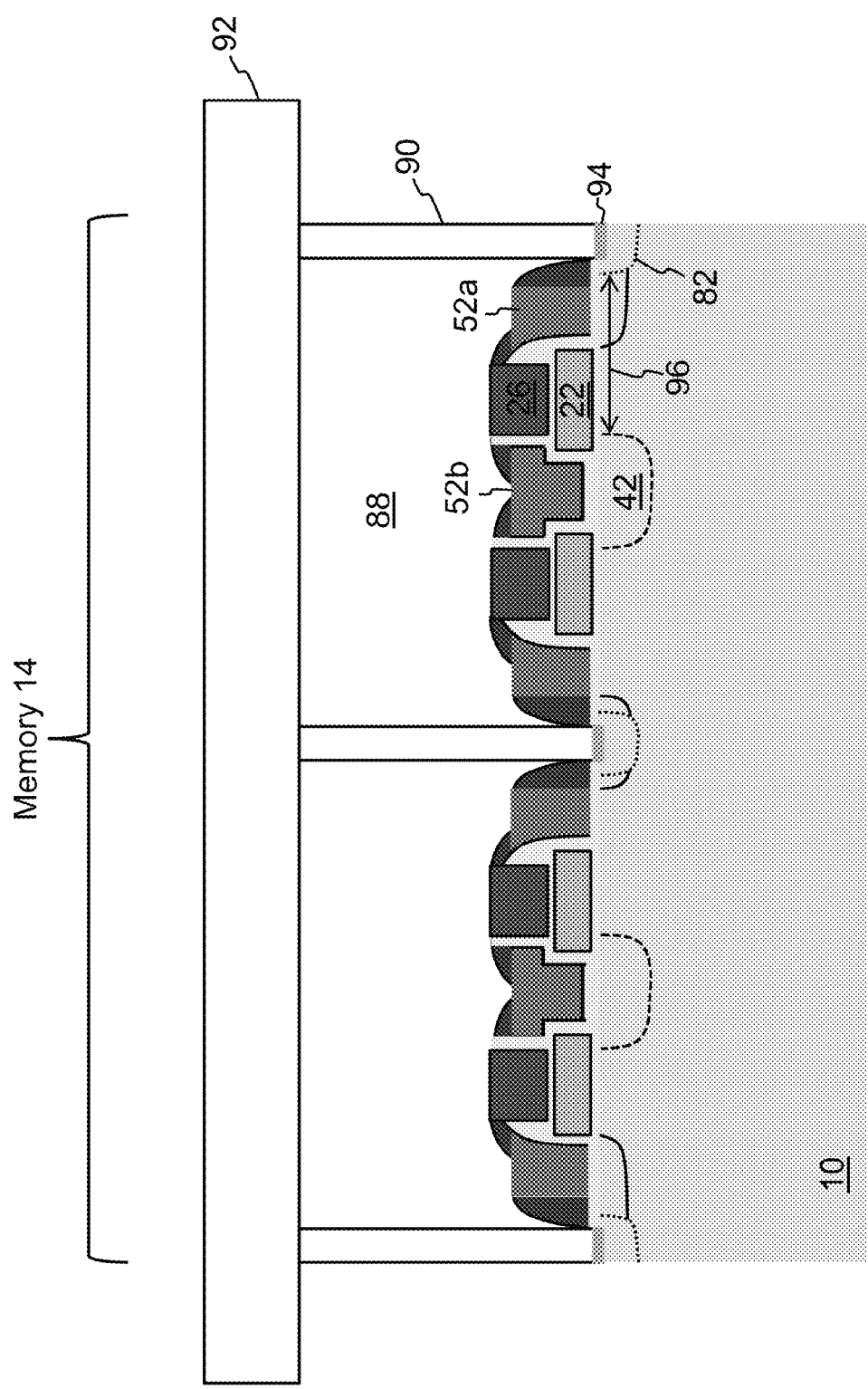
FIGS. 24A-24D are side cross sectional views of the memory, HV and core areas of the substrate, illustrating further steps in the formation of memory cells and logic devices therein.

As shown in FIG. 24A, pairs of memory cells are formed in the memory cell area 14. Each memory cell includes spaced apart source and drain regions 42 and 82, with a channel region 96 extending there between. A floating gate 22 is disposed over and insulated from a first portion of the channel region 96 for controlling its conductivity, and over a portion of the source region 42. A word line or select gate 52a is disposed over and insulated from a second portion of the channel region 96 for controlling its conductivity. An erase gate 52b is disposed over and insulated from the source region 42. The erase gate 52b includes a first portion that the laterally adjacent the floating gate 22, and a second portion that extends up and over the floating gate 22 (so that the erase gate wraps around the upper edge of the floating gate for enhancing erasure of electrons from the floating gate to the erase gate through the tunnel oxide 44).

Figure 24B:
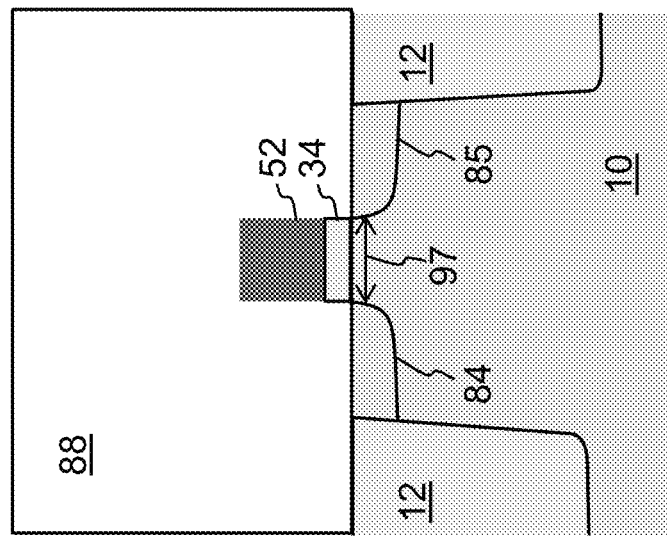

As shown in FIG. 24B, high voltage logic devices are formed in the HV area 16. Each logic device includes a conductive gate 52 disposed over and insulated from the substrate by gate oxide 34. Source and drain regions 84 and 85 are formed in the substrate 10 on either side of the logic gate 52, defining a channel region 97 there between. The high voltage logic devices use the same poly layer 52 as is used for the select gates 52a and erase gates 52b in the memory area 14.

Figure 24C:
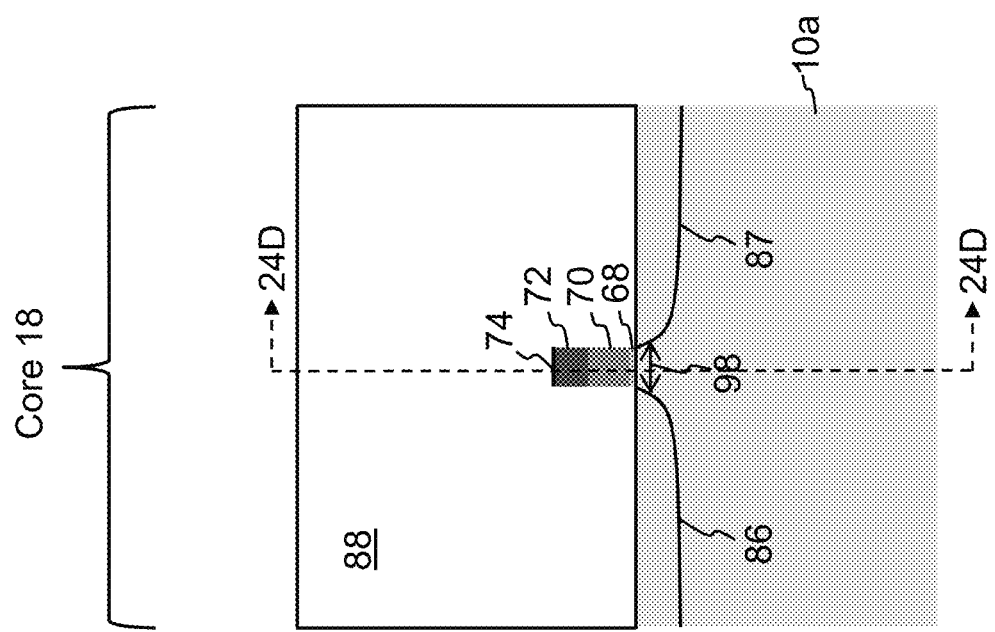
Figure 24D:
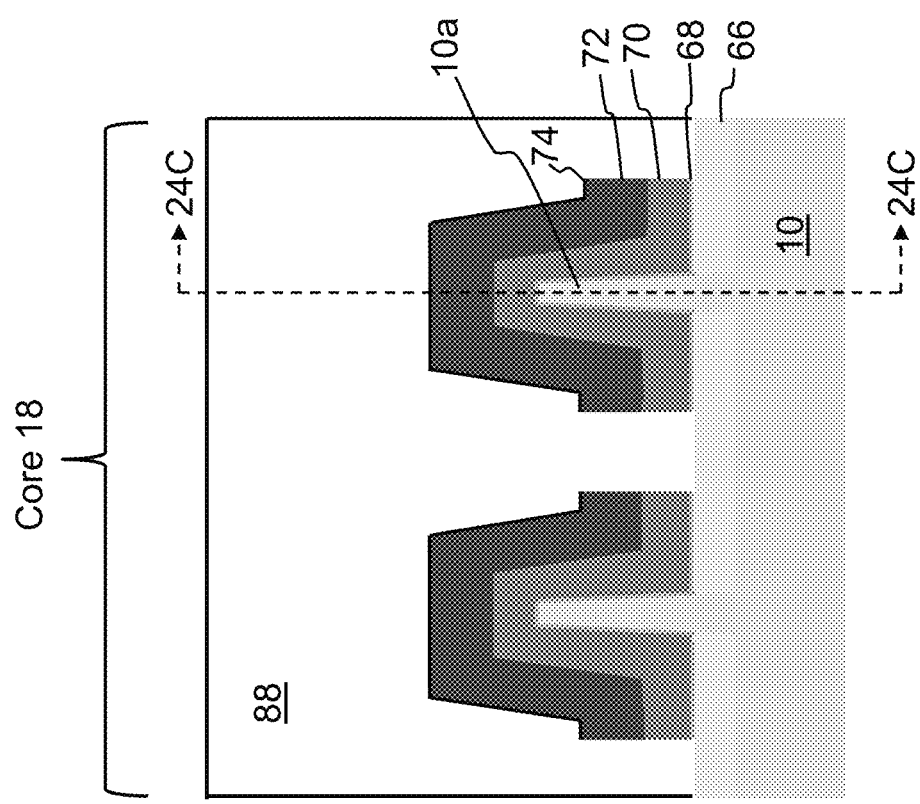

As shown in FIGS. 24C and 24D, FinFET logic devices are formed in the core logic area 18. Each logic device includes source and drain regions 84 and 86 formed in the top and side surfaces of the fin shaped portion 10a of the substrate 10, with a channel region 98 extending there between. Core logic gate 70 (made of metal) is disposed over and along the top and sides of the channel region of the fin shaped substrate portion 10a, and is insulated therefrom by high k dielectric layer 68.

The above disclosed method of fabrication has many advantages. First, it eliminates the formation of a control gate over the floating gate which is common in many memory cell designs, and relies instead on a self-aligned erase gate formed between a pair of floating gates, helping to reduce the overall height of the memory cell. Second, it integrates memory cells formed over a planar portion of a substrate's surface with FinFET logic devices that are formed over fin shaped surface portions of the same substrate (for enhancing the effective surface area of the channel region and corresponding logic gate without having to reduce the density of such logic devices on the substrate). Third, the memory devices are formed without adversely affecting the formation of the FinFET logic devices, and vice versa, by fabricating the memory cells up through poly planarization, and then ceasing memory cell formation while protecting the memory cell structure with a blocking layer of insulation while the FinFET logic devices are formed, and then removing the blocking layer of insulation and completing memory cell formation. Finally, in completing memory cell formation, the same poly layer used for the memory cell select and erase gates is also used for the HV logic gates, which simplifies manufacturing.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Further, not all method steps need be performed in the exact order illustrated. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory device, comprising:
   forming pairs of spaced apart first conductive blocks over and insulated from a first surface area of the substrate, wherein for each pair of the spaced apart first conductive blocks, an area between the first conductive blocks defines an inner region, and areas outside of the first conductive blocks define outer regions;
   forming a plurality of source regions each disposed in the substrate and in one of the inner regions;
   forming second conductive blocks each disposed over and insulated from one of the source regions;
   forming third conductive blocks each disposed in one of the outer regions, and disposed over and insulated from the substrate;
   forming a protective layer over the first, second and third conductive blocks;
   after the forming of the protective layer:
      performing a silicon etch in a second surface area of the substrate to form fins of the substrate, and
      forming fourth conductive blocks each extending along and insulated from top and side surfaces of one of the fins of the substrate; and
   after the performing of the silicon etch and the forming of the fourth conductive blocks:
      removing the protective layer,
      performing an etch to selectively remove a middle portion of each of the third conductive blocks,
      forming a plurality of drain regions each disposed in the substrate and adjacent to one of the third conductive blocks, and
      forming a second source region and a second drain region in each of the fins of the substrate.

2. The method of claim 1, wherein for each of the fins of the substrate, the fourth conductive block is disposed between the second source region and the second drain region.

3. The method of claim 1, wherein the forming of the second and third conductive blocks includes:
   forming a layer of conductive material over the substrate; and
   performing a chemical mechanical polish process to planarize a top surface of the layer of conductive material.

4. The method of claim 1, wherein the fourth conductive blocks are insulated from the top and side surfaces of the fins of the substrate by a high K dielectric layer.

5. The method of claim 4, wherein the fourth conductive blocks comprise a metal material.

6. The method of claim 5, wherein the first, second and third conductive blocks comprise a polysilicon material.

7. The method of claim 1, further comprising:
   forming fifth conductive blocks over and insulated from a third surface area of the substrate; and
   forming third source regions and third drain regions in the third surface area of the substrate adjacent to the fifth conductive blocks.

8. The method of claim 7, wherein the forming of the second, third and fifth conductive blocks comprises:
   forming a first oxide layer on the first surface area of the substrate;
   forming a second oxide layer on the third surface area of the substrate;
   forming a layer of polysilicon on the first and second oxide layers using a polysilicon deposition process;
   the performing of the etch to selectively remove the middle portion of each of the third conductive blocks further includes removing selected portions of the polysilicon layer over the second oxide layer;
   wherein the second oxide layer has a thickness greater than that of the first oxide layer.

9. A method of forming a memory device, comprising:
   forming pairs of spaced apart first conductive blocks over and insulated from a first surface area of the substrate, wherein for each pair of the spaced apart first conductive blocks, an area between the first conductive blocks defines an inner region, and areas outside of the first conductive blocks define outer regions;
   forming a plurality of source regions each disposed in the substrate and in one of the inner regions;

forming a first oxide layer on the first surface area of the substrate, and on second and third surface areas of the substrate;

removing the first oxide layer from the first surface area of the substrate;

forming a second oxide layer on the first surface area of the substrate;

forming a polysilicon layer over the first, second and third surface areas of the substrate;

planarizing a top surface of the polysilicon layer over the first surface area of the substrate, leaving first blocks of the polysilicon layer each disposed over and insulated from one of the source regions and second blocks of the polysilicon layer each disposed in one of the outer regions and on the second oxide layer;

forming a protective layer over the first conductive blocks and over the first and second blocks of the poly silicon layer;

after the forming of the protective layer:
  removing the polysilicon layer and the first oxide layer from the second surface area of the substrate,
  performing a silicon etch in a second surface area of the substrate to form fins of the substrate, and
  forming second conductive blocks each extending along and insulated from top and side surfaces of one of the fins of the substrate;

after the performing of the silicon etch and the forming of the second conductive blocks:
  removing the protective layer,
  performing an etch to selectively remove a middle portion of each of the second blocks of the polysilicon, and selected portions of the polysilicon layer over the third surface area of the substrate leaving third blocks of the polysilicon,
  forming a plurality of drain regions each disposed in the substrate and adjacent to one of the second blocks of polysilicon,
  forming a second source region and a second drain region in each of the fins of the substrate, and
  forming third source regions and third drain regions in the third surface area of the substrate adjacent to the third blocks of the polysilicon.

10. The method of claim 9, wherein the second oxide layer has a thickness greater than that of the first oxide layer.

11. The method of claim 9, wherein for each of the fins of the substrate, the second conductive block is disposed between the second source region and the second drain region.

12. The method of claim 9, wherein the second conductive blocks are insulated from the top and side surfaces of the fins of the substrate by a high K dielectric layer.

13. The method of claim 12, wherein the second conductive blocks comprise a metal material.

* * * * *